(12) United States Patent
Kang et al.

(10) Patent No.: US 12,490,569 B2
(45) Date of Patent: Dec. 2, 2025

(54) DISPLAY DEVICE INCLUDING LIGHT EMITTING ELEMENTS BETWEEN FIRST AND SECOND ELECTRODES AND METHOD FOR MANUFACTURING THE SAME

(71) Applicant: SAMSUNG DISPLAY CO., LTD., Yongin-si (KR)

(72) Inventors: Sin Chul Kang, Yongin-si (KR); Su Mi Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 574 days.

(21) Appl. No.: 17/784,471

(22) PCT Filed: Nov. 17, 2020

(86) PCT No.: PCT/KR2020/016162
§ 371 (c)(1),
(2) Date: Jun. 10, 2022

(87) PCT Pub. No.: WO2021/118088
PCT Pub. Date: Jun. 17, 2021

(65) Prior Publication Data
US 2023/0005987 A1   Jan. 5, 2023

(30) Foreign Application Priority Data
Dec. 11, 2019 (KR) .................. 10-2019-0165079

(51) Int. Cl.
*H10H 29/14* (2025.01)
*G09G 3/3233* (2016.01)
(Continued)

(52) U.S. Cl.
CPC ......... *H10H 29/142* (2025.01); *G09G 3/3233* (2013.01); *H10H 20/01* (2025.01);
(Continued)

(58) Field of Classification Search
CPC ..... H01L 27/156; H01L 33/005; H01L 33/24; H01L 27/124; H01L 27/1255;
(Continued)

(56) References Cited

U.S. PATENT DOCUMENTS 9,773,761 B2  9/2017 Do
9,786,697 B2  10/2017 Lee et al.
(Continued)

FOREIGN PATENT DOCUMENTS

CN    110034149        7/2019
KR  10-2003-0058148    7/2003
(Continued)

OTHER PUBLICATIONS

International Search Report, with English translation, corresponding to International Application No. PCT/KR2020/016162 dated Feb. 23, 2021.
(Continued)

*Primary Examiner* — Norman D Richards
*Assistant Examiner* — Laura M Dykes
(74) *Attorney, Agent, or Firm* — Womble Bond Dickinson (US) LLP

(57) ABSTRACT

A display device and a manufacturing method of the display device are provided. A display device includes a conductive line disposed on a substrate, a first capacitor electrode disposed on the conductive line and electrically connected to the conductive line, a passivation layer disposed on the first capacitor electrode, a first electrode disposed on the passivation layer and at least partially overlapping the first capacitor electrode in a plan view, a second electrode spaced apart from the first electrode, the second electrode and the first electrode being disposed on a same layer, and light emitting elements disposed between the first electrode and the second electrode.

22 Claims, 27 Drawing Sheets

(51) Int. Cl.
  *H10H 20/01* (2025.01)
  *H10H 20/821* (2025.01)
  *H10H 20/84* (2025.01)

(52) U.S. Cl.
  CPC .......... *H10H 20/821* (2025.01); *H10H 20/84* (2025.01); *G09G 2300/0426* (2013.01); *G09G 2300/0819* (2013.01); *G09G 2300/0842* (2013.01)

(58) Field of Classification Search
  CPC ......... G09G 3/3233; G09G 2300/0426; G09G 2300/0819; G09G 2300/0842
  USPC ........................................................ 257/40
  See application file for complete search history.

(56) References Cited

U.S. PATENT DOCUMENTS

| | | |
|---|---|---|
| 10,236,332 B2 | 3/2019 | Jung et al. |
| 10,461,123 B2 | 10/2019 | Kim et al. |
| 10,672,946 B2 | 6/2020 | Cho et al. |
| 10,943,947 B2 | 3/2021 | Im et al. |
| 11,069,726 B2 | 7/2021 | Kim et al. |
| 2016/0254337 A1 | 9/2016 | Choi et al. |
| 2017/0338211 A1 | 11/2017 | Lin et al. |
| 2017/0358503 A1* | 12/2017 | Liu ................ B65G 43/08 |
| 2018/0114823 A1 | 4/2018 | Lee et al. |
| 2018/0358339 A1 | 12/2018 | Iguchi |
| 2019/0172819 A1 | 6/2019 | Bae et al. |
| 2020/0020672 A1* | 1/2020 | Xi ..................... H10H 20/857 |
| 2021/0066538 A1* | 3/2021 | Liu .................... H01L 27/1255 |
| 2021/0265329 A1* | 8/2021 | Woo .................. H10H 20/857 |

FOREIGN PATENT DOCUMENTS

| | | |
|---|---|---|
| KR | 10-1490758 | 2/2015 |
| KR | 10-2016-0150199 | 12/2016 |
| KR | 10-2018-0007376 | 1/2018 |
| KR | 10-2018-0072909 | 7/2018 |
| KR | 10-2019-0042130 A | 4/2019 |
| KR | 10-2000642 | 7/2019 |
| KR | 10-2019-0095638 | 8/2019 |
| KR | 10-2019-0121894 | 10/2019 |

OTHER PUBLICATIONS

Written Opinion, with English translation, corresponding to International Application No. PCT/KR2020/016162, dated Feb. 23, 2021.

* cited by examiner

FIG. 1A
FIG. 1B
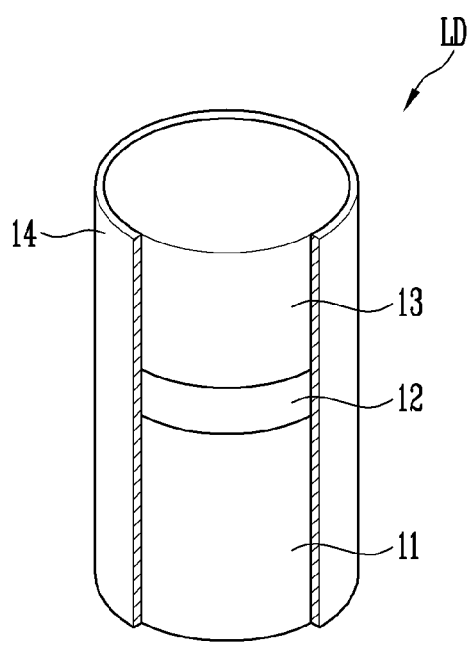
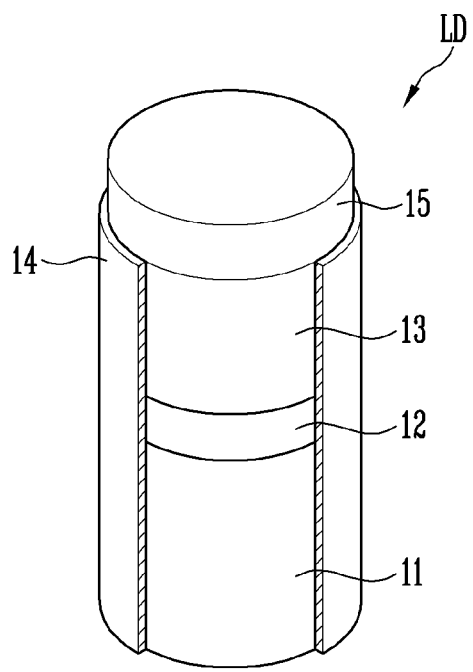

DISPLAY DEVICE INCLUDING LIGHT EMITTING ELEMENTS BETWEEN FIRST AND SECOND ELECTRODES AND METHOD FOR MANUFACTURING THE SAME

CROSS-REFERENCE TO RELATED APPLICATION(S)

This application is a national entry of International Application No. PCT/KR2020/016162, filed on Nov. 17, 2020, which claims under 35 U.S.C. § 119(a) and 365(b) priority to and benefits of Korean Patent Application No. 10-2019-0165079, filed on Dec. 11, 2019 in the Korean Intellectual Property Office, the entire contents of which are incorporated herein by reference.

BACKGROUND

1. Technical Field

The disclosure relates to a display device and a manufacturing method thereof.

2. Description of the Related Art

A display device can display an image by using a light emitting element such as a light emitting diode as a light source of a pixel. The light emitting diode has relatively good durability even in harsh environmental conditions and excellent performance in terms of life-span and luminance.

Research has been conducted in the manufacturing of a light emitting diode using a material having a high reliability inorganic crystal structure, and disposing it on a display panel of a display device and using it as a pixel light source. As a part of the research, development of a display device that manufactures a micro-scale or nano-scale light emitting diode and uses it as a light source for each pixel is being conducted.

A display device using such a light emitting diode as a light emitting element may include alignment wires, and the light emitting element may be aligned between the alignment wires by applying a voltage to the alignment wires. In case that a noise component is included in the voltage applied to the alignment wires, a problem in that the light emitting element is not or is non-uniformly aligned between the alignment wires may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Accordingly, a problem to be solved by the disclosure is to provide a display device and a manufacturing method thereof that may increase manufacturing efficiency while readily aligning light emitting elements between alignment wires.

Objectives of the disclosure are not limited to the objectives mentioned above, and other objectives may be clearly understood to a person of ordinary skill in the art using the following description.

An embodiment may include a display device including a conductive line disposed on a substrate; a first capacitor electrode disposed on the conductive line and electrically connected to the conductive line; a passivation layer disposed on the first capacitor electrode; a first electrode disposed on the passivation layer and at least partially overlapping the first capacitor electrode in a plan view; a second electrode spaced apart from the first electrode, the second electrode and the first electrode being disposed on a same layer, and light emitting elements disposed between the first electrode and the second electrode.

The passivation layer may include an insulation material, and the first capacitor electrode and the first electrode may form a first capacitor.

The display device may further include a transistor disposed between the substrate and the light emitting elements and electrically connected to the light emitting elements, wherein the transistor may include a semiconductor pattern disposed on the substrate; a gate electrode disposed on the semiconductor pattern; and a first transistor electrode and a second transistor electrode disposed on the gate electrode and electrically connected to the semiconductor pattern; and the conductive line and the gate electrode may be disposed on a same layer.

The first electrode may be electrically connected to a first power line, and the first electrode may receive a first driving voltage through the first power line.

The first transistor electrode may be electrically connected to the second electrode, and the second transistor electrode may be electrically connected to a second power line and may receive a second driving voltage through the second power line, the second driving voltage being greater than the first driving voltage.

The first capacitor electrode and the second power line may be disposed on a same layer.

At least a portion of the second power line may overlap the second electrode in a plan view, the passivation layer may be disposed between the second power line and the second electrode, and the second power line and the second electrode may form a second capacitor.

The first capacitor electrode and the first transistor electrode may be disposed on a same layer.

The conductive line may extend in a first direction in a plan view, and the first power line may extend in a second direction intersecting the first direction in a plan view.

The display device may further include a first connection electrode electrically connecting the first electrode to the first power line and extending in the first direction, wherein the first electrode may extend in the second direction, at least a portion of the first connection electrode may overlap the first capacitor electrode in a plan view, and the first electrode, the first connection electrode, and the first power line may be integral with each other.

The display device may further include a third electrode, the third electrode and the second electrode being disposed on a same layer, wherein the first electrode may be disposed between the second electrode and the third electrode in a plan view, and the light emitting elements may be disposed between the first electrode and the third electrode.

The display device may further include a second connection electrode electrically connecting the second electrode to the third electrode and extending in the first direction, wherein the second electrode, the third electrode, and the second connection electrode may be integral with each other.

The display device may further include a third electrode electrically contacting the first electrode and a first end portion of the light emitting elements; and a fourth electrode electrically contacting the second electrode and a second end portion of the light emitting elements.

The display device may further include an insulation layer disposed on the first electrode and the second electrode, wherein the insulation layer may include a first opening exposing at least a portion of the first electrode; and a second opening exposing at least a portion of the second electrode, the third electrode may electrically contact the first electrode through the first opening of the insulation layer, and the fourth electrode may electrically contact the second electrode through the second opening of the insulation layer.

The display device may further include a fixing layer disposed on the insulation layer and the light emitting elements, wherein the fixing layer may contact at least a portion of an outer circumferential surface of each of the light emitting elements, and may expose the first end portion and the second end portion of each of the light emitting elements.

The display device may further include a first bank disposed between the first electrode and the passivation layer and overlapping the first electrode in a plan view; and a second bank disposed between the second electrode and the passivation layer and overlapping the second electrode in a plan view.

An embodiment provides a display device that may include a conductive line disposed on a substrate; a first capacitor electrode disposed on the conductive line and electrically connected to the conductive line; a second capacitor electrode disposed on the conductive line and spaced apart from the first capacitor electrode; a passivation layer disposed on the first capacitor electrode and the second capacitor electrode; a first electrode disposed on the passivation layer and at least partially overlapping the first capacitor electrode in a plan view; a second electrode spaced apart from the first electrode and at least partially overlapping the second capacitor electrode in a plan view, the second electrode and the first electrode being disposed on a same layer; and light emitting elements disposed between the first electrode and the second electrode.

The passivation layer may include an insulation material, the first capacitor electrode and the first electrode may form a first capacitor, and the second capacitor electrode and the second electrode may form a second capacitor.

The first capacitor electrode and the second capacitor electrode may be disposed on a same layer.

The display device may further include a transistor disposed between the substrate and the light emitting elements and electrically connected to the light emitting elements, wherein the transistor may include a semiconductor pattern disposed on the substrate; a gate electrode disposed on the semiconductor pattern; and a first transistor electrode and a second transistor electrode disposed on the gate electrode and electrically connected to the semiconductor pattern, the first transistor electrode may be electrically connected to the second electrode, the second transistor electrode may be electrically connected to the second capacitor electrode, and the conductive line and the gate electrode may be disposed on a same layer.

The conductive line may extend in a first direction in a plan view, and the second capacitor electrode may extend in a second direction intersecting the first direction in a plan view.

The display device may further include a third electrode, the third electrode and the second electrode may be disposed on a same layer; and a second connection electrode electrically connecting the second electrode to the third electrode and extending in the first direction, wherein the first electrode may be disposed between the second electrode and the third electrode in a plan view, and the light emitting elements may be disposed between the first electrode and the third electrode.

The display device may further include a third capacitor electrode, the third capacitor electrode and the second capacitor electrode being disposed on a same layer; and a third connection electrode electrically connecting the second capacitor electrode to the third capacitor electrode and extending in the first direction, wherein at least a portion of the third capacitor electrode may overlap the third electrode in a plan view, at least a portion of the third connection electrode may overlap the second connection electrode in a plan view, and the first capacitor electrode, the second capacitor electrode, the third capacitor electrode, and the third connection electrode may be disposed on a same layer.

An embodiment provides a manufacturing method of a display device that may include forming a first power line on a substrate; forming a first capacitor electrode electrically connected to the first power line on an upper portion of the first power line; forming a first electrode at least partially overlapping the first capacitor electrode in a plan view and a second electrode spaced apart from the first electrode, on an upper portion the first capacitor electrode; supplying a first voltage to the first power line; supplying a second voltage to the first electrode; and supplying a third voltage to the second electrode to align light emitting elements between the first electrode and the second electrode, wherein the first voltage, the second voltage, and the third voltage may be different voltages.

The first voltage and the second voltage may be direct current voltages, and the third voltage may be an alternating current voltage.

In the aligning of the light emitting elements, the first capacitor electrode and the first electrode may form a first capacitor, and the first capacitor may bypass an alternating current voltage component of a voltage supplied to the first electrode to the first power line.

The forming of the first capacitor electrode may include forming a second capacitor electrode spaced apart from the first capacitor electrode, and at least a portion of the second capacitor electrode may overlap the second electrode in a plan view.

In the aligning of the light emitting elements, the second capacitor electrode and the second electrode may form a second capacitor, and the second electrode may receive the third voltage from the second capacitor electrode through the second capacitor.

The first voltage may be a value between a positive peak voltage and a negative peak voltage of the third voltage, and the second voltage may be a ground voltage.

Other embodiments are included in the detailed description and drawings.

According to the display device and the manufacturing method thereof according to embodiments, it is possible to remove an alternating current noise component of a ground voltage applied to a first electrode by forming a first capacitor electrode under or below the first electrode to which a first voltage, which is the ground voltage for aligning light emitting elements, is applied. Accordingly, an alignment characteristic of the light emitting elements may be improved.

According to the display device and the manufacturing method thereof according to embodiments, it is possible to remove a direct current noise component of an alternating current voltage applied to a second electrode by forming a second capacitor electrode under or below the second electrode to which a second voltage, which is the alternating current voltage for aligning light emitting elements, is applied. Accordingly, an alignment characteristic of the light emitting elements may be improved.

According to embodiments, as noise components of voltages applied to alignment electrodes are removed, a uniform electric field is formed between alignment wires, so that light emitting elements may be uniformly aligned in each pixel. Accordingly, display quality and manufacturing efficiency of a display device may be improved.

Effects of embodiments are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which:

FIG. 1A and FIG. 1B illustrate schematic perspective views of a light emitting element according to an embodiment.

DETAILED DESCRIPTION OF THE EMBODIMENTS

Figure 2:
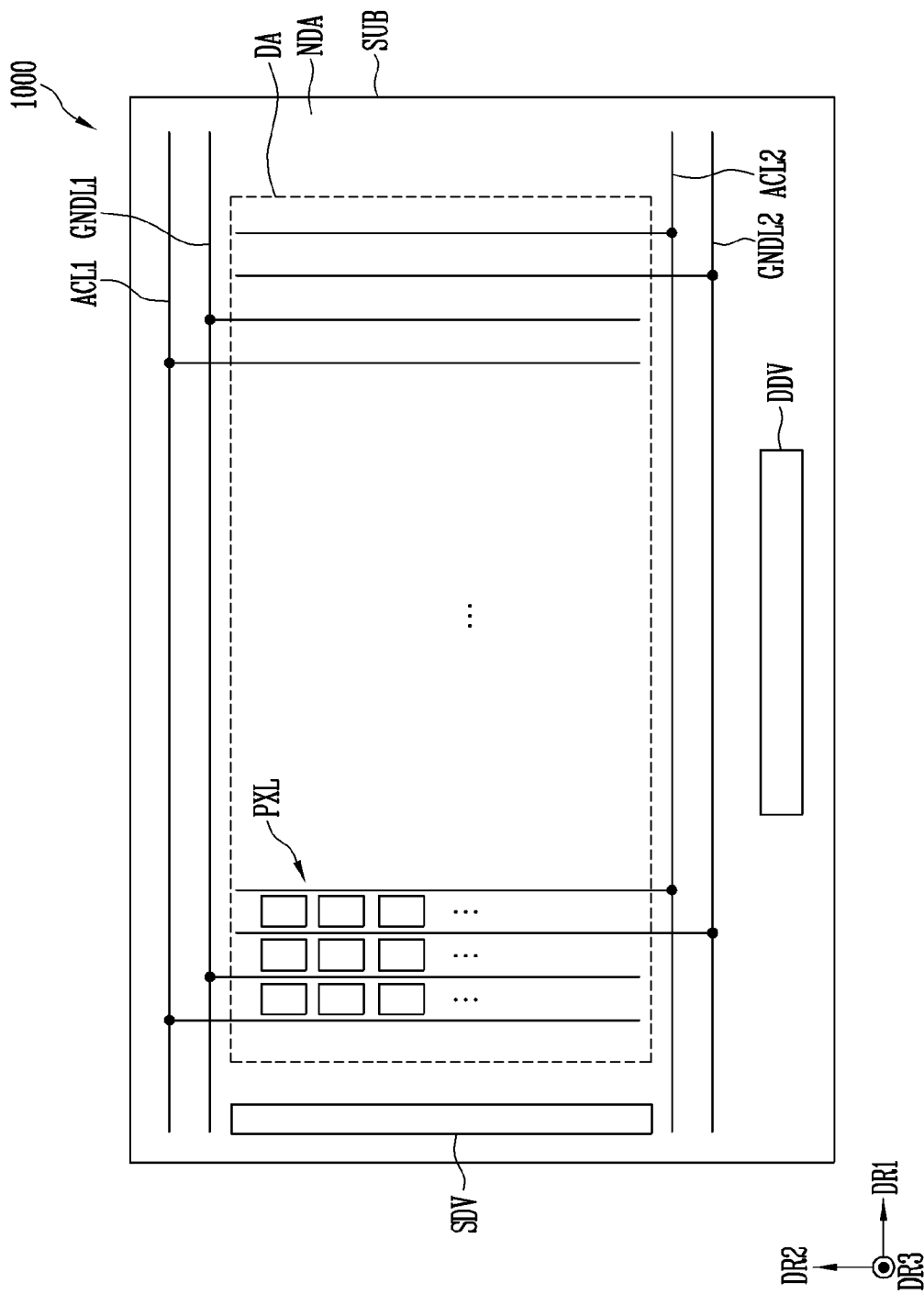
FIG. 2 illustrates a schematic top plan view of a display device according to an embodiment.

Advantages and features of the disclosure and methods of accomplishing the same may be understood more readily by reference to the following detailed description of embodiments and the accompanying drawings. However, the disclosure is not limited to the embodiments described herein, and may be embodied in many different forms, and the following embodiments are provided to make the disclosure complete and to allow those skilled in the art to clearly understand the scope of the disclosure, and the disclosure is also defined by the appended claims.

It will be understood that when an element or a layer is referred to as being 'on' another element or layer, it can be directly on another element or layer, or intervening elements or layers may also be present. Throughout the specification, the same reference numerals denote the same constituent elements.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The shapes, sizes, ratios, angles, numbers, and the like disclosed in the drawings for describing embodiments are illustrative, and thus the disclosure is not limited to the illustrated embodiments. For example, in the drawings, sizes, thicknesses, ratios, and dimensions of the elements may be exaggerated for ease of description and for clarity. Like numbers refer to like elements throughout.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the spirit and scope of the disclosure.

Singular forms are intended to include plural forms unless the context clearly indicates otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments may be coupled or combined with each other partly or entirely, and may be variously modified in a manner that is understandable to those skilled in the art. Each embodiment may be independent of each other and may be combinable with other embodiments.

Hereinafter, embodiments will be described in detail with reference to the accompanying drawings. The same or similar reference numerals are used for the same constituent elements on the drawing.

FIG. 1A and FIG. 1B illustrate schematic perspective views of a light emitting element according to an embodiment.

Referring to FIG. 1A and FIG. 1B, a light emitting element LD according to an embodiment may include a first semiconductor layer 11, a second semiconductor layer 13, and an active layer 12 interposed between the first and second semiconductor layers 11 and 13. For example, the light emitting element LD may be implemented as a stacked body in which the first semiconductor layer 11, the active layer 12, and the second semiconductor layer 13 may be sequentially stacked each other.

According to an embodiment, the light emitting element LD may be provided to have a rod-like shape extending along one direction or a direction. In case that an extending direction of the light emitting element LD is referred to as a length direction, the light emitting element LD may be provided with one end portion and the other end portion along the length direction.

In an embodiment, one of the first and second semiconductor layers 11 and 13 may be disposed at one end portion or an end portion, and the other one of the first and second semiconductor layers 11 and 13 may be disposed at the other end portion or another end portion.

In an embodiment, the light emitting element LD may be provided to have a rod-like shape. Here, the term "rod shape" may include a rod-like shape or a bar-like shape long in the length direction (for example, an aspect ratio larger than 1), such as a cylindrical or polygonal pillar. For example, a length of the light emitting element LD may be larger than a diameter thereof. However, the disclosure is not limited thereto. The light emitting element LD may be a light emitting element having a core-shell structure.

The light emitting element LD may be manufactured to have, for example, a diameter and/or a length of about a micro-scale or a nano-scale. For example, the diameter of the light emitting element LD may be about 600 nm or less, and the length of the light emitting element LD may be about 4 µm or less, but the size of the light emitting element LD is not limited thereto, and the size of the light emitting element LD may be changed to meet requirements of the display device to which the light emitting element LD is applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN, and may include a semiconductor layer doped with a first dopant such as Si, Ge, Sn, or the like within the spirit and the scope of the disclosure. The material included in the first semiconductor layer 11 is not limited thereto, and the first semiconductor layer 11 may be made of various materials.

The active layer 12 is formed on the first semiconductor layer 11, and may be formed to have a single or multi-quantum well structure. In case that the active layer 12 includes a material having the multi-quantum well structure, quantum layers and well layers may be alternately stacked each other.

In case that an electric field of a given voltage or more is applied to respective end portions of the light emitting element LD, the light emitting element LD emits light while electron-hole pairs are combined in the active layer 12. By controlling the light emitting of the light emitting element LD by using this principle, the light emitting element LD may be used as a light source for various light emitting devices in addition to pixels of a display device.

The active layer 12 may emit light having a wavelength in a range of about nm to about 900 nm. For example, in case that the active layer 12 emits light in a blue wavelength band, it may include a material such as AlGaN or AlGaInN. For example, in case that the active layer 12 has a structure in which a quantum layer and a well layer are alternately stacked each other in a multi-quantum well structure, the quantum layer may include an inorganic material such as AlGaN or AlGaInN, and the well layer may include a material such as GaN or AlInN. In the embodiment, the active layer 12 may include AlGaInN as the quantum layer and AlInN as the well layer, and as described above, the active layer 12 may emit blue light having a central wavelength band ranging from about 450 nm to about 495 nm.

However, the disclosure is not limited thereto, and the active layer 12 may have a structure in which a semiconductor material having large band gap energy and a semiconductor material having small band gap energy may be alternately stacked each other, or may include group 3 to group 5 semiconductor materials according to a wavelength band of light that emits light. The light emitted by the active layer 12 is not limited to light of a blue wavelength band, and in some cases, it may be light of a red or green wavelength band.

On the other hand, the light emitted by the active layer 12 may be emitted from both side surfaces as well as an outer surface in a length direction of the light emitting element LD. Directionality of the light emitted by the active layer 12 is not limited to one direction or a direction.

The second semiconductor layer 13 is provided on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a semiconductor layer doped with a second dopant such as Mg, Zn, Ca, Se, and Ba. The material included in the second semiconductor layer 13 is not limited thereto, and the second semiconductor layer 13 may be formed of various materials.

In the drawing, it is illustrated that the first semiconductor layer 11 and the second semiconductor layer 13 are formed as one layer, but the disclosure is not limited thereto. For example, the first semiconductor layer 11 and the second semiconductor layer 13 may include a larger number of layers depending on the material of the active layer 12. For example, the first semiconductor layer 11 and the second semiconductor layer 13 may further include a clad layer or a tensile strain barrier reducing (TSBR) layer.

According to an embodiment, the light emitting element LD may additionally include a phosphor layer, another active layer, another semiconductor layer, and/or an electrode layer in an upper portion and/or a lower portion of each of the first semiconductor layer 11, the active layer 12, and the second semiconductor layer 13 described above.

As an example, the light emitting element LD may further include at least one electrode layer disposed at one end or an end (for example, an upper surface of the light emitting element LD) side of the second semiconductor layer 13 or at one end or an end (for example, a lower surface of the light emitting element LD) side of the first semiconductor layer 11. For example, the light emitting element LD may further include an electrode layer 15 disposed at one end side or an end side of the second semiconductor layer 13 as shown in FIG. 1B. The electrode layer 15 may be an ohmic electrode, but is not limited thereto. For example, the electrode layer 15 may be a Schottky contact electrode. The electrode layer 15 may include a metal or a metal oxide, for example, chromium (Cr), titanium (Ti), aluminum (Al), gold (Au), nickel (Ni), an indium tin oxide (ITO), an indium zinc oxide (IZO), and an indium tin-zinc oxide (ITZO), and an oxide thereof or an alloy thereof, which may be used alone or in combination, but is not limited thereto. In addition, in an embodiment, the electrode layer 15 may be substantially transparent or translucent. Accordingly, light generated by the light emitting element LD may pass through the electrode layer 15 to be emitted to the outside of the light emitting element LD.

The light emitting element LD may further include an insulation film 14. However, according to an embodiment, the insulation film 14 may be omitted, or it may be provided so as to cover or overlap only some or a number of the first semiconductor layer 11, the active layer 12, and the second semiconductor layer 13. For example, the insulation film 14 may be provided at a portion other than both end portions of the light emitting element LD, so that both end portions of the light emitting element LD may be exposed.

For convenience of description, FIG. 1A and FIG. 1B illustrate a structure in which a portion of the insulation film 14 is removed, and an entire lateral surface of an actual light emitting element LD may be surrounded by the insulation film 14.

According to an embodiment, the insulation film 14 may include a transparent insulation material. For example, the insulation film 14 may include at least one or more insulation material of $SiO_2$, $Si_3N_4$, $Al_2O_3$, and $TiO_2$, but is not limited thereto, and may include various materials having insulating properties.

The insulation film 14 may prevent an electrical short circuit that may occur in case that the active layer 12 contacts conductive materials other than the first semiconductor layer 11 and the second semiconductor layer 13. By forming the insulation film 14, a surfacial defect of the light emitting element LD may be minimized, thereby improving lifetime and efficiency. In case that light emitting elements LD are closely disposed, the insulation film 14 may prevent an unwanted short circuit that may occur between respective light emitting elements LD.

The type, structure, and shape of the light emitting element LD according to an embodiment may be variously changed. It is to be understood that the shapes disclosed herein may include shapes substantially identical or similar to the shapes.

FIG. 2 illustrates a schematic top plan view of a display device according to an embodiment.

Referring to FIG. 1A to FIG. 2, a display device 1000 may include a substrate SUB and pixels PXL provided on the substrate SUB. The display device 1000 (or the substrate SUB) may include a display area DA in which the pixels PXL are disposed to display an image, and a non-display area NDA excluding the display area DA.

The display area DA may be an area in which the pixels PXL are provided. The non-display area NDA may be an area in which drivers SDV and DDV for driving the pixels PXL, and various wires for connecting the pixels PXL and the drivers are provided.

The display area DA may have various shapes. For example, the display area DA may be provided in various shapes such as a closed polygon including a side formed of a straight line, a circle, an ellipse, and the like including a side formed of a curved line, a semicircle, semi-ellipse, and the like including a side formed of a straight line and a curved line.

In case that the display area DA includes areas, each area may also be provided in various shapes such as a closed polygon including a side formed of a straight line, a semicircle, a semi-ellipse, and the like including a side formed of a curved line. Areas of plural areas may be the same as or different from each other. In an embodiment, a case in which the display area DA is provided as one area or an area having a quadrangle shape including a side of a straight line will be described as an example.

The non-display area NDA may be provided at least one side or a side of the display area DA. In an embodiment, the non-display area NDA may surround or may be adjacent to the display area DA.

The pixels PXL may be provided in the display area DA on the substrate SUB. Each of the pixels PXL may include at least one light emitting element (LD of FIG. 1A) connected to a scan line and a data line to be driven by a corresponding scan signal and data signal.

Each of the pixels PXL may emit one of red, green and blue colors, but is not limited thereto. For example, each of the pixel PXL may emit one of cyan, magenta, yellow and white colors.

As an example, the pixels PXL may include a first pixel emitting light of a first color, a second pixel emitting light of a second color different from the first color, and a third pixel emitting light of a third color different from the first color and the second color. At least one first pixel, second pixel, and third pixel disposed to be adjacent to each other may form one pixel unit that emits light of various colors.

In an embodiment, the first pixel may be a red pixel emitting red light, the second pixel may be a green pixel emitting green light, and the third pixel may be a blue pixel emitting blue light.

In the embodiment, respective pixels PXL are provided with light emitting elements that emit light of a same color as each other, but include light conversion layers of different colors disposed on respective light emitting elements to emit light of different colors. In an embodiment, respective pixels PXL may include light emitting elements emitting light of different colors. However, the color, type, and/or number of respective pixels PXL are not particularly limited.

Pixels PXL may be provided and arranged or disposed along a first direction DR1 and a second direction DR2 crossing or intersecting the first direction DR1. However, the arrangement form of the pixels PXL is not particularly limited, and the pixels PXL may be arranged or disposed in various forms.

The drivers provide a signal to respective pixels PXL through respective wire parts (not shown), and thus may control driving of respective pixels PXL. In FIG. 2, the wire part is omitted for convenience of description.

The driver may include the scan driver SDV that provides a scan signal to the pixels PXL through a scan line, the data driver DDV that provides a data signal to the pixels PXL through a data line, and a timing controller (not shown). The timing controller may control the scan driver SDV and the data driver DDV. In an embodiment, the display device 1000 may further include a light emitting driver that provides a light emitting control signal to the pixels PXL through a light emitting control line.

The scan driver SDV may be disposed at one side or a side of the substrate SUB, and may be disposed along one direction or a direction (for example, the second direction DR2). The scan driver SDV may be mounted on the substrate SUB as a separate part, but is not limited thereto. For example, the scan driver SDV may be formed on or directly formed on the substrate SUB. The scan driver SDV may be positioned outside the substrate SUB, and may be connected to respective pixels PXL through a separate connection member. The scan driver SDV may be disposed at a same side of the substrate SUB, but is not limited thereto, may be disposed at different sides thereof.

The data driver DDV may be disposed at one side or a side of the substrate SUB, and may be disposed along a direction (for example, the first direction DR1) crossing or intersecting the above-described scan driver SDV. The data driver DDV may be mounted on the substrate SUB as a separate part, or may be positioned outside the substrate SUB and connected to respective pixels PXL through a separate connection member.

In the embodiment, each of the pixels PXL may be an active pixel. However, the type, structure and/or driving method of the pixels PXL applied to the disclosure is not particularly limited.

The display device 1000 may include alignment wires ACL1, ACL2, GNDL1, and GNDL2 that are disposed on the substrate SUB and align (or dispose) the light emitting elements LD of respective pixels PXL. The alignment wires ACL1, ACL2, GNDL1, and GNDL2 may include alternating current voltage wires ACL1 and ACL2 and ground voltage wires GNDL1 and GNDL2.

The alternating current voltage wires ACL1 and ACL2 and the ground voltage wires GNDL1 and GNDL2 may be alternately disposed. For example, a first alternating current voltage wire ACL1, a first ground voltage wire GNDL1, a second alternating current voltage wire ACL2, and a second ground voltage wire GNDL2 may be sequentially arranged or disposed. Each of the alternating current voltage wires ACL1 and ACL2 and the ground voltage wires GNDL1 and GNDL2 may include a main wire extending along the first direction DR1, and branch wires that branch from the main wire to extending along the second direction DR2.

The pixels PXL may be disposed between branch wires of the alternating current voltage wires ACL1 and ACL2 and the ground voltage wires GNDL1 and GNDL2. In a process of aligning the light emitting elements LD on the substrate SUB, an alternating current voltage and ground voltage may be applied to each of the alternating current voltage wires ACL1 and ACL2 and the ground voltage wires GNDL1 and GNDL2. A dipole is induced according to an electric field formed between the alternating current voltage wires ACL1 and ACL2 and the ground voltage wires GNDL1 and GNDL2, so that the light emitting elements LD may be aligned in respective pixels PXL by electrophoretic force.

The alignment wires ACL1, ACL2, GNDL1, and GNDL2 may be connected to each other during the process of aligning the light emitting elements LD and may be extended, but after aligning the light emitting elements LD, at least some or a number thereof may be separated. For example, the alternating current voltage wires ACL1 and ACL2 or the ground voltage wires GNDL1 and GNDL2 may be separated from each other by a size (or length) corresponding to each of the pixels PXL. The process of aligning the light emitting elements LD will be described later in detail with reference to FIG. 13 to FIG. 18.

Figure 3A:
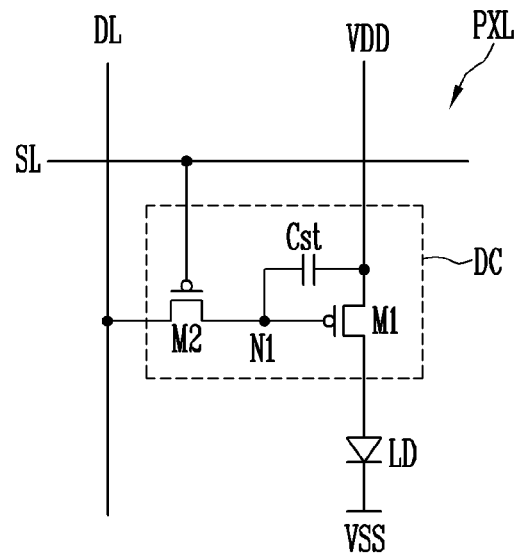
FIG. 3A to FIG. 3C illustrate schematic diagrams of an equivalent circuit of a pixel according to an embodiment, respectively.
Figure 3B:
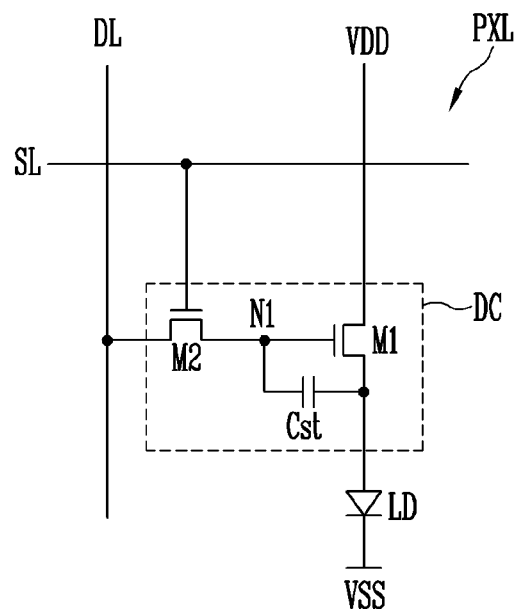
Figure 3C:
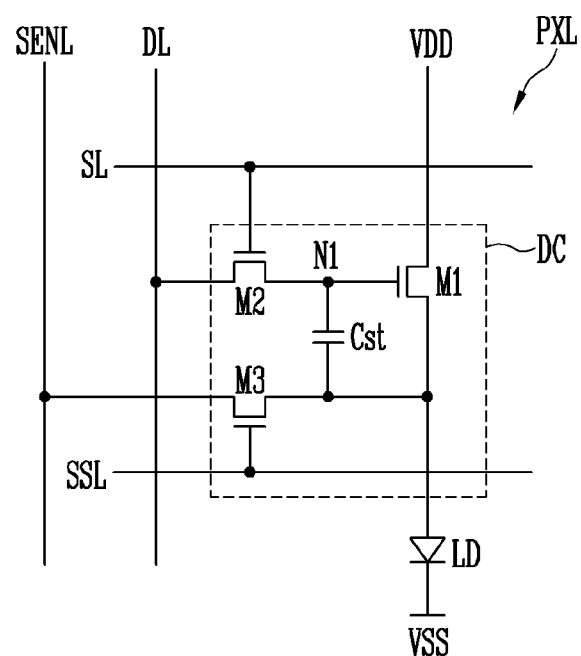

FIG. 3A to FIG. 3C respectively illustrate schematic diagrams of an equivalent circuit of a pixel according to an embodiment. For example, FIG. 3A to FIG. 3C illustrate examples of pixels forming a light emitting display panel of an active type.

Referring to FIG. 1A to FIG. 3A, the pixel PXL may include at least one light emitting element LD and a pixel driving circuit (or driving circuit) DC connected thereto to drive the light emitting element LD.

A first electrode (for example, anode electrode) of the light emitting element LD may be connected to a second driving power source VDD via the driving circuit DC, and a second electrode (for example, cathode electrode) of the light emitting element LD may be connected to a first driving power source VSS. The light emitting element LD may emit light with luminance corresponding to an amount of driving current controlled by the driving circuit DC.

Although only one light emitting element LD is illustrated in FIG. 3A, this is an example configuration, and an actual pixel PXL may include light emitting elements LD. Light emitting elements LD may be connected in parallel and/or in series to each other.

The first driving power source VSS and the second driving power source VDD may have different potentials. For example, a potential of the second driving power source VDD may be higher than a potential of the first driving power source VSS by a threshold voltage of the light emitting element LD or more. For example, a voltage applied through the second driving power source VDD may be larger than that applied through the first driving power source VSS.

According to an embodiment, the driving circuit DC may include a first transistor M1, a second transistor M2, and a storage capacitor Cst.

A first electrode of the first transistor M1 (driving transistor) may be connected to the second driving power source VDD, and a second electrode may be electrically connected to the first electrode (for example, anode electrode) of the light emitting element LD. A gate electrode of the first transistor M1 may be connected to a first node N1. The first transistor M1 may control an amount of a driving current supplied to the light emitting elements LD in response to a voltage of the first node N1.

A first electrode of the second transistor M2 (switching transistor) may be connected to a data line DL, and a second electrode thereof may be connected to the first node N1. Here, the first electrode and the second electrode of the second transistor M2 may be different electrodes, and for example, in case that the first electrode is a source electrode, the second electrode may be a drain electrode. A gate electrode of the second transistor M2 may be connected to a scan line SL.

The second transistor M2 is turned on in case that a scan signal of a voltage at which the first transistor M1 may be turned on (for example, a gate-on voltage) is supplied from the scan line SL, so that it may electrically connect the data line DL and the first node N1. A data signal of a corresponding frame is supplied to the data line DL, and accordingly, the data signal may be transmitted to the first node N1. The data signal transmitted to the first node N1 may be stored in the storage capacitor Cst.

One electrode of the storage capacitor Cst may be connected to the first driving power source VSS, and the other electrode thereof may be connected to the first node N1. The storage capacitor Cst may be charged with the voltage corresponding to the data signal supplied to the first node N1, and may maintain the charged voltage until a data signal of a next frame is supplied.

For better understanding and ease of description, FIG. 3A illustrates the relatively simple driving circuit DC including the second transistor M2 for transmitting the data signal into respective pixels PXL, the storage capacitor Cst for storing the data signal, and the first transistor M1 for supplying a driving current corresponding to the data signal to the light emitting element LD.

However, the disclosure is not limited thereto, and the structure of the driving circuit DC may be variously changed. For example, the driving circuit DC additionally include various transistors such as a compensation transistor for compensating a threshold voltage of the first transistor M1, an initialization transistor for initializing the first node N1, and/or a light emitting control transistor for controlling a light emitting time of the light emitting element LD, and other circuit elements such as a boosting capacitor for boosting the voltage of the first node N1.

Transistors included in the driving circuit DC, for example, both the first and second transistors M1 and M2 are shown as P-type transistors in FIG. 3A, but the disclosure is not limited thereto. For example, at least one of the first and second transistors M1 and M2 included in the driving circuit DC may be changed to an N-type transistor.

For example, as shown in FIG. 3B, the first and second transistors M1 and M2 of the driving circuit DC may be implemented as N-type transistors. The driving circuit DC shown in FIG. 3B is similar in configuration or operation to the driving circuit DC shown in FIG. 3A except for a change of a connection position of some or a number of constituent elements due to a change of a transistor type. Therefore, a detailed description thereof will be omitted.

As another example, referring to FIG. 3C, the pixel PXL may further include a third transistor M3 (sensing transistor).

A gate electrode of the third transistor M3 may be connected to a sensing signal line SSL. One electrode of the third transistor M3 may be connected to a sensing line SENL, and the other electrode of the third transistor M3 may be connected to the anode electrode of the light emitting element LD. The third transistor M3 can transmit a voltage value at the anode electrode of the light emitting element LD to the sensing line SENL according to a sensing signal supplied to the sensing signal line SSL during a sensing period. The voltage transmitted through the sensing line SENL may be provided to an external circuit (for example, a timing controller), and the external circuit may extract characteristic information (for example, a threshold voltage of the first transistor M1) of the pixel PXL based on the provided voltage. The extracted characteristic information may be used to convert image data so that a characteristic deviation of the pixel PXL is compensated.

Figure 4:
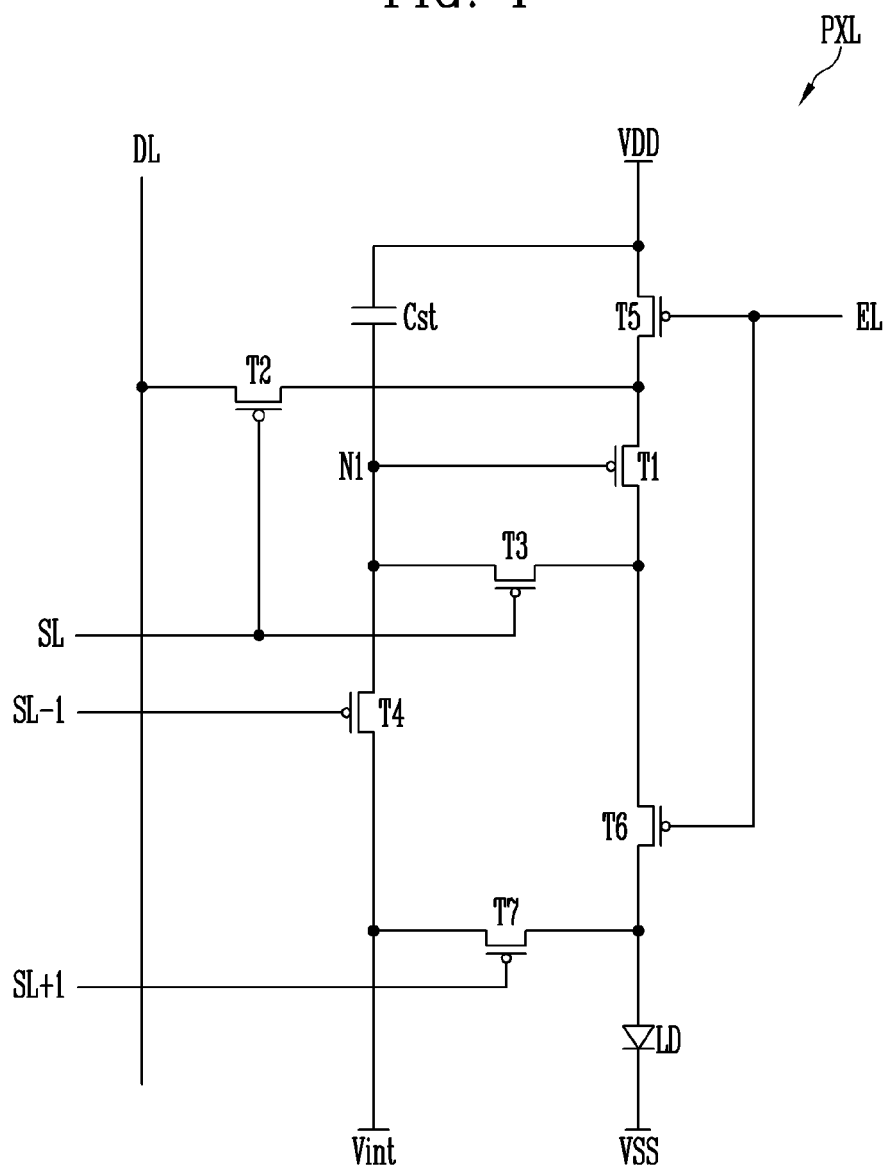
FIG. 4 illustrates a schematic diagram of an equivalent circuit of a pixel according to an embodiment.

FIG. 4 illustrates a schematic diagram of an equivalent circuit of a pixel according to an embodiment.

Referring to FIG. 4, the pixel PXL according to an embodiment may include a light emitting element LD, first to seventh transistors T1, T2, T3, T4, T5, T6, and T7, and a storage capacitor Cst.

A first electrode (for example, anode electrode) of the light emitting element LD may be connected to the first transistor T1 via the sixth transistor T6, and a second electrode (for example, cathode electrode) of the light emitting element LD may be connected to the first driving power source VSS. The light emitting element LD may emit light with a luminance corresponding to an amount of driving current supplied from the first transistor T1.

One electrode of the first transistor T1 (driving transistor) may be connected to the second driving power source VDD via the fifth transistor T5, and the other electrode of the first transistor T1 may be connected to the first electrode of the light emitting element LD via the sixth transistor T6. The first transistor T1 may control an amount of current flowing from the second driving power source VDD to the first driving power source VSS via the light emitting element LD in response to a voltage of the first node N1 which is a gate electrode of the first transistor T1.

The second transistor T2 (switching transistor) may be connected between the data line DL and one electrode of the first transistor T1. A gate electrode of the second transistor T2 may be connected to the first scan line SL. The second transistor T2 may be turned on in case that a scan signal of a gate-on voltage is supplied to the first scan line SL to electrically connect the data line DL and one electrode of the first transistor T1.

The third transistor T3 may be connected between the other electrode of the first transistor T1 and the first node N1. A gate electrode of the third transistor T3 may be connected to the first scan line SL. The third transistor T3 may be turned on in case that a scan signal of a gate-on voltage is supplied to the first scan line SL to electrically connect the other electrode of the first transistor T1 and the first electrode.

The fourth transistor T4 may be connected between the first node N1 and an initialization power source Vint. A gate electrode of the fourth transistor T4 may be connected to a second scan line SL−1. The fourth transistor T4 may be turned on in case that a scan signal of a gate-on voltage is supplied to the second scan line SL−1 to supply a voltage of the initialization power source Vint to the first node N1. Here, the initialization power source Vint may be set to a voltage lower than the data signal. The scan signal supplied to the second scan line SL−1 may have a same waveform as the scan signal supplied to the first scan line of a pixel of a previous stage.

The fifth transistor T5 may be connected between the second driving power source VDD and one electrode of the first transistor T1. A gate electrode of the fifth transistor T5 may be connected to a light emitting control line EL. The fifth transistor T5 may be turned on in case that a light emitting control signal of a gate-on voltage is supplied to the light emitting control line EL, and may be turned off in other cases.

The sixth transistor T6 may be connected between the other electrode of the first transistor T1 and the first electrode of the light emitting element LD. A gate electrode of the sixth transistor T6 may be connected to the light emitting control line EL. The sixth transistor T6 may be turned on in case that a light emitting control signal of a gate-on voltage is supplied to the light emitting control line EL, and may be turned off in other cases.

The seventh transistor T7 may be connected between the initialization power source Vint and the first electrode (for example, anode electrode) of the light emitting element LD. A gate electrode of the seventh transistor T7 may be connected to a third scan line SL+1. The seventh transistor T7 may be turned on in case that a scan signal of a gate-on voltage is supplied to the third scan line SL+1 to supply a voltage of the initialization power source Vint to the first electrode of the light emitting element LD. The scan signal supplied to the third scan line SL+1 may have a same waveform as the scan signal supplied to the first scan line of a pixel of a next stage.

FIG. 4 illustrates the case in which a gate electrode of the seventh transistor T7 is connected to the third scan line SL+1. However, the technical idea of the disclosure is not limited thereto. For example, in an embodiment, the gate electrode of the seventh transistor T7 may be connected to the first scan line SL or the second scan line SL−1. In case that the scan signal of the gate-on voltage is supplied to the first scan line SL or second scan line SL−1, the voltage of the initialization power source Vint may be supplied to the anode electrode of the light emitting element LD via the seventh transistor T7.

The storage capacitor Cst may be connected between the second driving power source VDD and the first node N1. A data signal and a voltage corresponding to a threshold voltage of the first transistor T1 may be stored in the storage capacitor Cst.

The transistors included in the driving circuit DC, for example, the first to seventh transistors T1, T2, T3, T4, T5, T6, and T7 are all shown as P-type transistors in FIG. 4, but the disclosure is not limited thereto. For example, at least one of the first to seventh transistors T1, T2, T3, T4, T5, T6, and T7 may be changed to an N-type transistor.

Figure 5:
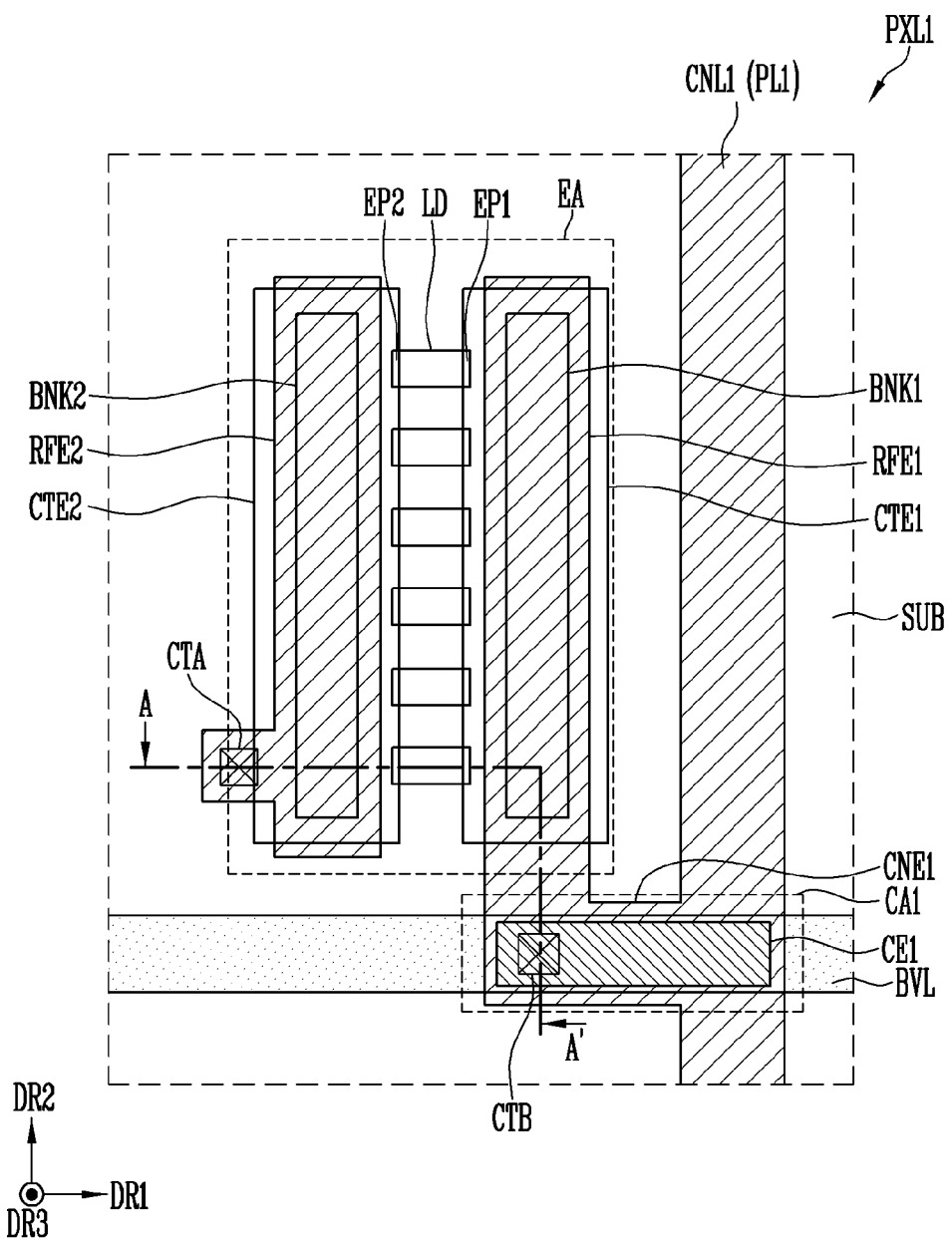
FIG. 5 illustrates a schematic top plan view of a pixel according to an embodiment.
Figure 6:
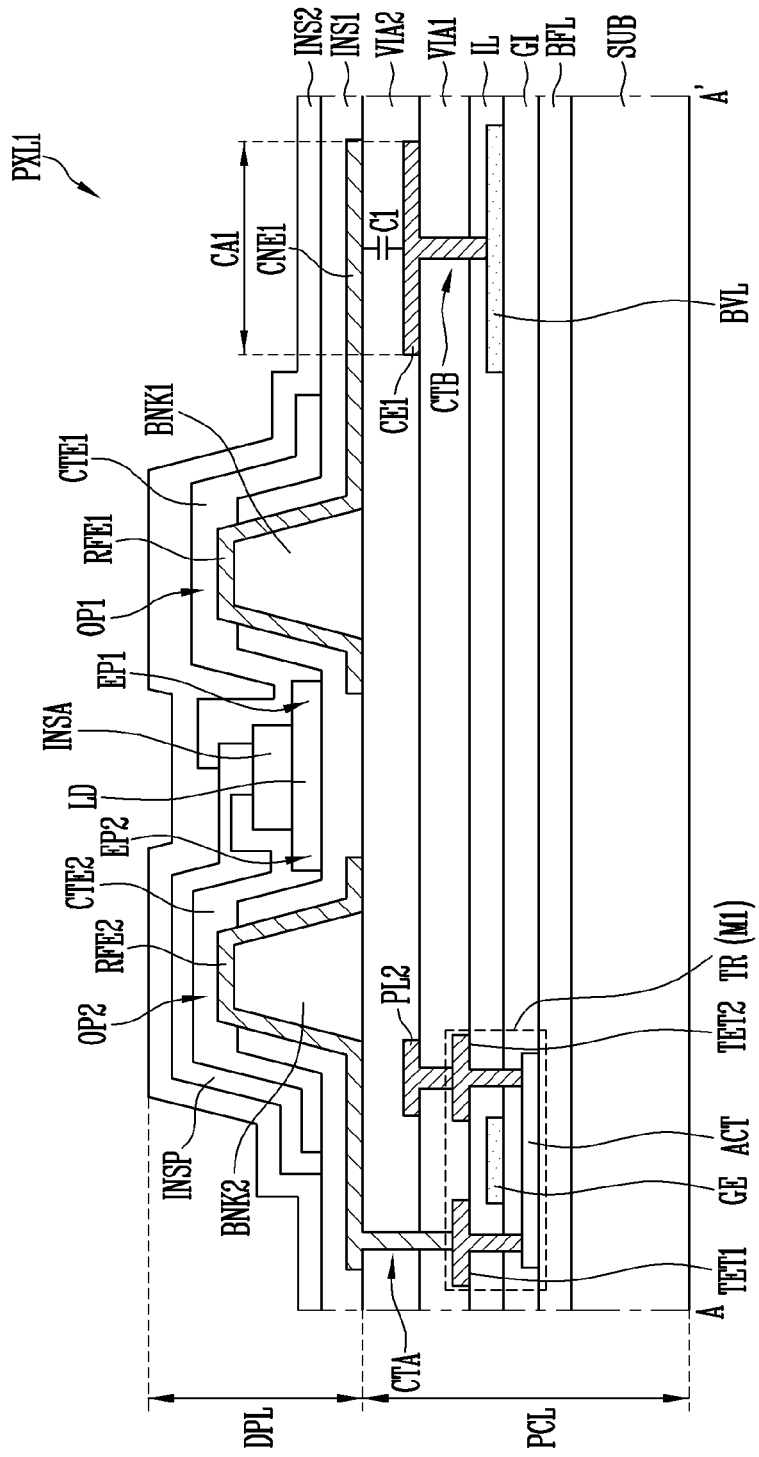
FIG. 6 illustrates a schematic cross-sectional view taken along line A-A' of FIG. 5.

FIG. 5 illustrates a schematic top plan view of a pixel according to an embodiment. FIG. 6 illustrates a schematic cross-sectional view taken along line A-A' of FIG. 5. FIG. 7 to FIG. 11 illustrate schematic cross-sectional views of a pixel according to various embodiment, and illustrate schematic cross-sectional views taken along line A-A' of FIG. 5.

For better understanding and ease of description, hereinafter, each of the electrodes is simplified and illustrated as a single electrode layer, but the disclosure is not limited thereto, and each of the electrodes may be formed of electrode layers. In an embodiment, "formed and/or disposed on a same layer" may mean formed in a same process and formed of a same material or a similar material.

In FIG. 5, for better understanding and ease of description, illustration of the transistors connected to the light emitting elements and of the signal wires connected to the transistors is omitted.

Referring to FIG. 5 and FIG. 6, a display device according to an embodiment may include a substrate SUB and a pixel PXL1 provided on the substrate SUB.

The substrate SUB may be a rigid substrate or a flexible substrate, and its material or physical properties are not particularly limited. For example, the substrate SUB may be a rigid substrate made of glass or tempered glass, or a flexible substrate made of a thin film made of plastic or metal. The substrate SUB may be a transparent substrate, but is not limited thereto. For example, the substrate SUB may be a translucent substrate, an opaque substrate, or a reflective substrate.

The pixel PXL1 illustrated in FIG. 5 may be one of the pixels PXL of FIG. 2. One pixel PXL1 may be a minimum unit emitting light of a color. As described above, pixels emitting light of different colors may form one pixel unit. Hereinafter, the pixel PXL1 may mean a pixel or sub pixel.

The pixel PXL1 may include a pixel circuit layer PCL disposed on the substrate SUB and a display element layer DPL disposed on the pixel circuit layer PCL.

The pixel circuit layer PCL may include circuit elements forming the driving circuit (DC in FIG. 3A) of the pixel PXL. FIG. 6 illustrates a cross-sectional structure in which the pixel circuit layer PCL may include a transistor TR. The transistor TR may be the first transistor M1 of FIG. 3A to FIG. 3C. However, the structure of the pixel circuit layer PCL is not limited thereto, and the pixel circuit layer PCL may further include circuit elements positioned in an area different from that of the transistor TR.

The transistors included in the pixel circuit layer PCL may have a substantially equivalent or similar cross-sectional structure. The structures of respective transistors are not limited to the structure illustrated in FIG. 6.

The pixel circuit layer PCL may include layers. For example, the pixel circuit layer PCL may include a buffer layer BFL, a gate insulation layer GI, an interlayer insulation layer IL, a first passivation layer VIA1, and a second passivation layer VIA2, which may be sequentially stacked each other on the substrate SUB. Each of the above-mentioned layers may be an insulation layer including an organic insulation material or an inorganic insulation material. The pixel circuit layer PCL may include the transistor TR, a bypass power line (or, a conductive line) BVL, and a first capacitor electrode CE1.

The buffer layer BFL may prevent impurities from diffusing into each circuit element. The buffer layer BFL may be provided as a single film, but may be provided as a multi-film of at least double or more layers. In case that the buffer layer BFL is provided as the multi-film, respective layers may be made of a same material or a similar material or different materials. The buffer layer BFL may be omitted depending on the material, a process condition, and the like of the substrate SUB.

The transistor TR may be disposed on the buffer layer BFL. The transistor TR may include a semiconductor pattern ACT, a gate electrode GE, a first transistor electrode TET1, and a second transistor electrode TET2.

The semiconductor pattern ACT may be disposed between the buffer layer BFL and the gate insulation layer GI. In case that the pixel circuit layer PCL does not include the buffer layer BFL, the semiconductor pattern ACT may be disposed between the substrate SUB and the gate insulation layer GI. The semiconductor pattern ACT may include a first region contacting the first transistor electrode TET1, a second region connected to the second transistor electrode TET2, and a channel region positioned between the first and second regions. One of the first and second regions may be a source region, and the other thereof may be a drain region.

The semiconductor pattern ACT may be a semiconductor pattern made of poly silicon, amorphous silicon, an oxide semiconductor, or the like within the spirit and the scope of the disclosure. The channel region of the semiconductor pattern ACT may be an intrinsic semiconductor as a semiconductor pattern that is not doped with impurities, and each of the first and second regions of the semiconductor pattern ACT may be a semiconductor pattern doped with impurities.

The gate electrode GE may be disposed between the gate insulation layer GI and the interlayer insulation layer IL, and may overlap at least a portion of the semiconductor pattern ACT. The gate electrode GE may be insulated from the semiconductor pattern ACT by the gate insulation layer GI.

The first and second transistor electrodes TET1 and TET2 may be disposed on the interlayer insulation layer IL. The first and second transistor electrodes TET1 and TET2 may be electrically connected to the semiconductor pattern ACT. For example, the first and second transistor electrodes TET1 and TET2 may contact the first and second regions of the semiconductor pattern ACT through contact holes passing through the gate insulation layer GI and the interlayer insulation layer IL, respectively.

The first transistor electrode TET1 may be connected to a second electrode RFE2 through a contact hole CTA passing through the first passivation layer VIA1 and the second passivation layer VIA2. In an embodiment, a separate connection member may be disposed between the first transistor electrode TET1 and the second electrode RFE2. The first transistor electrode TET1 may be connected to the connection member through a contact hole, and the connection member may be connected to the second electrode RFE2 through another contact hole. A position at which the connection member is disposed may be between the first passivation layer VIA1 and the second passivation layer VIA2, but is not limited thereto.

The second electrode RFE2 may receive a driving current through the first transistor electrode TET1.

The second transistor electrode TET2 may be connected to a second power line PL2. The second power line PL2 may be a power line connected to the second driving power source (VDD in FIG. 3A). For example, the voltage of the second driving power source VDD may be provided to the transistor TR through the second power line PL2. A passivation layer (for example, the second passivation layer VIA2) may be disposed between the second power line PL2 and the second electrode RFE2. Although not shown in FIG. 5, the second power line PL2 may extend along the second direction DR2 in a plan view. However, the second power line PL2 is not limited thereto, and may extend along the first direction DR1.

The pixel circuit layer PCL may include the bypass power line BVL and the first capacitor electrode CE1 disposed to be spaced apart from the transistor TR.

The bypass power line BVL may be a power line formed on a same layer as the gate electrode GE of the transistor TR described above. The bypass power line BVL may be formed in an area that does not overlap a light emitting area EA in a plan view. The light emitting area EA may be an area in which the light emitting elements LD are disposed to emit light. The bypass power line BVL may be formed by extending along the first direction DR1 in a plan view in an area that does not overlap the light emitting area EA.

The bypass power line BVL may not overlap gate electrodes of transistors included in the pixel circuit layer PCL. For example, the bypass power line BVL may not overlap the gate electrode GE of the transistor TR.

The first capacitor electrode CE1 may be disposed on the bypass power line BVL. The first capacitor electrode CE1 may overlap the bypass power line BVL. For example, the first capacitor electrode CE1 may be formed to overlap the bypass power line BVL and extend in the first direction DR1.

At least one insulation layer or passivation layer may be disposed between the bypass power line BVL and the first capacitor electrode CE1. For example, the interlayer insulation layer IL and the first passivation layer VIA1 may be disposed between the bypass power line BVL and the first capacitor electrode CE1.

The first capacitor electrode CE1 may contact the bypass power line BVL through a contact hole CTB. Accordingly, a voltage applied to the bypass power line BVL may be transmitted to the first capacitor electrode CE1.

At least a portion of the first capacitor electrode CE1 may overlap a first electrode RFE1 disposed thereon. An area in which the first capacitor electrode CE1 and the first electrode RFE1 overlap may be a first capacitor area CA1. The first capacitor area CA1 may not overlap the light emitting area EA in which the light emitting elements LD are disposed.

At least one passivation layer or insulation layer may be disposed between the first capacitor electrode CE1 and the first electrode RFE1. For example, the second passivation layer VIA2 may be disposed between the first capacitor electrode CE1 and the first electrode RFE1. For example, in the first capacitor area CAL the first capacitor electrode CE1 and the first electrode RFE1 may form a first capacitor C1 together with the second passivation layer VIA2 interposed therebetween.

In the process of aligning the light emitting elements LD on the substrate SUB, a direct current voltage may be supplied to the bypass power line BVL and the first electrode RFE1, respectively. The direct current voltage supplied to the bypass power line BVL may be transmitted to the first capacitor electrode CE1. As described above, the first capacitor electrode CE1 and the first electrode RFE1 may form the first capacitor C1, and the first capacitor electrode CE1 may receive a noise component (for example, an alternating current voltage component) of a voltage supplied to the first electrode RFE1 through the first capacitor C1. Accordingly, the noise component (alternating current voltage component) of the direct current voltage supplied to the first electrode RFE1 may be removed. In this regard, it will be described later in detail with reference to FIG. 13 to FIG. 18.

The disposition of the first capacitor electrode CE1 is not limited to the above description. For example, a pixel PXL1a of FIG. 7 may include a first capacitor electrode CE1a disposed between the interlayer insulation layer IL and the first passivation layer VIA1.

The first capacitor electrode CE1a may be connected to the bypass power line BVL through the contact hole CTB passing through the interlayer insulation layer IL. In the first capacitor area CA1, the first capacitor electrode CE1a and the first electrode RFE1 may form a first capacitor C1a together with the first passivation layer VIA1 and the second passivation layer VIA2 interposed therebetween.

Figure 8:
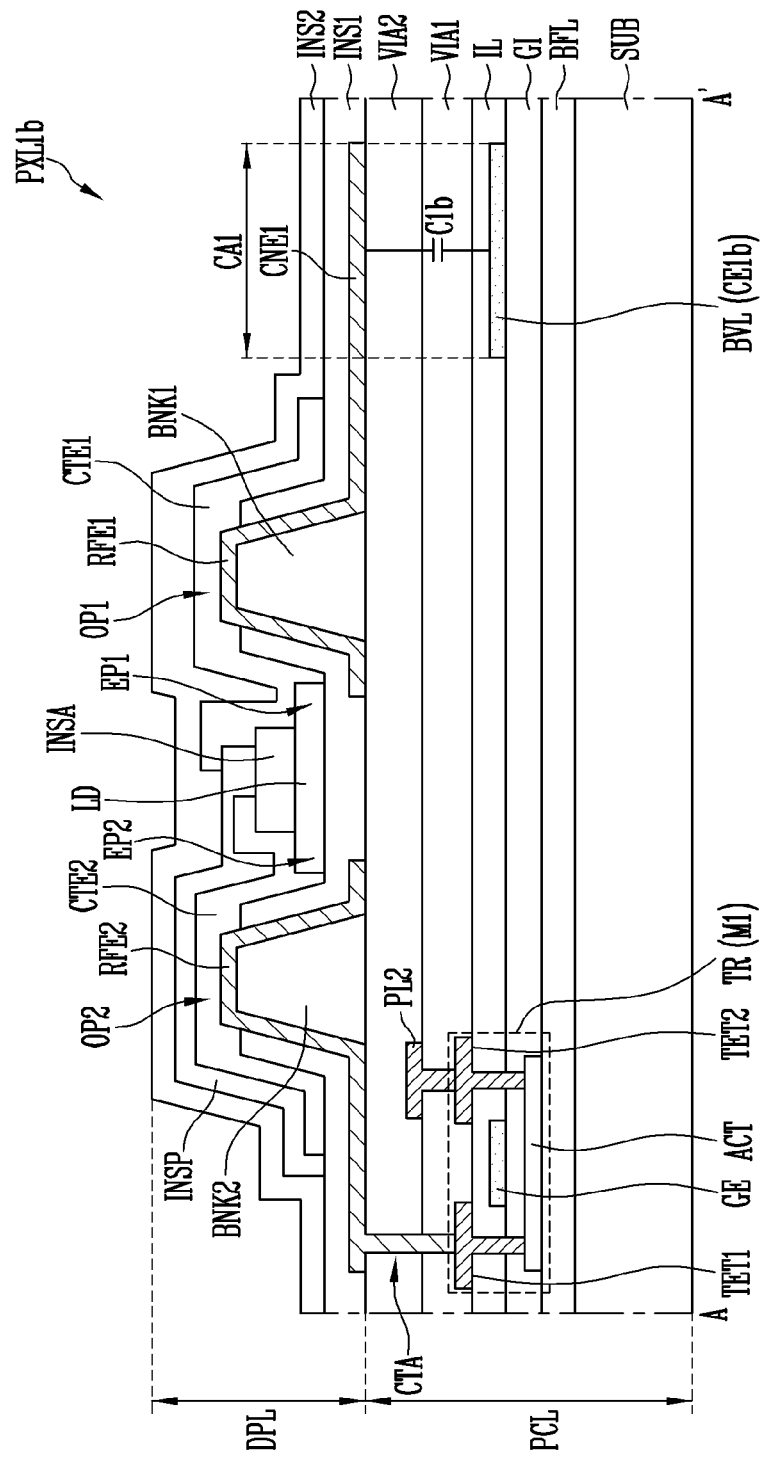

As another example, a pixel PXL1b of FIG. 8 may not include a separate electrode disposed between the bypass power line BVL and the first electrode RFE1. The bypass power line BVL may function as a first capacitor electrode CE1b in an area overlapping the first electrode RFE1. For example, in the first capacitor area CA1, the bypass power line BVL (or first capacitor electrode CE1b) and the first electrode RFE1 may form a first capacitor C1b together with the interlayer insulation layer IL, the first passivation layer VIA1 and the second passivation layer VIA2 interposed therebetween.

Figure 7:
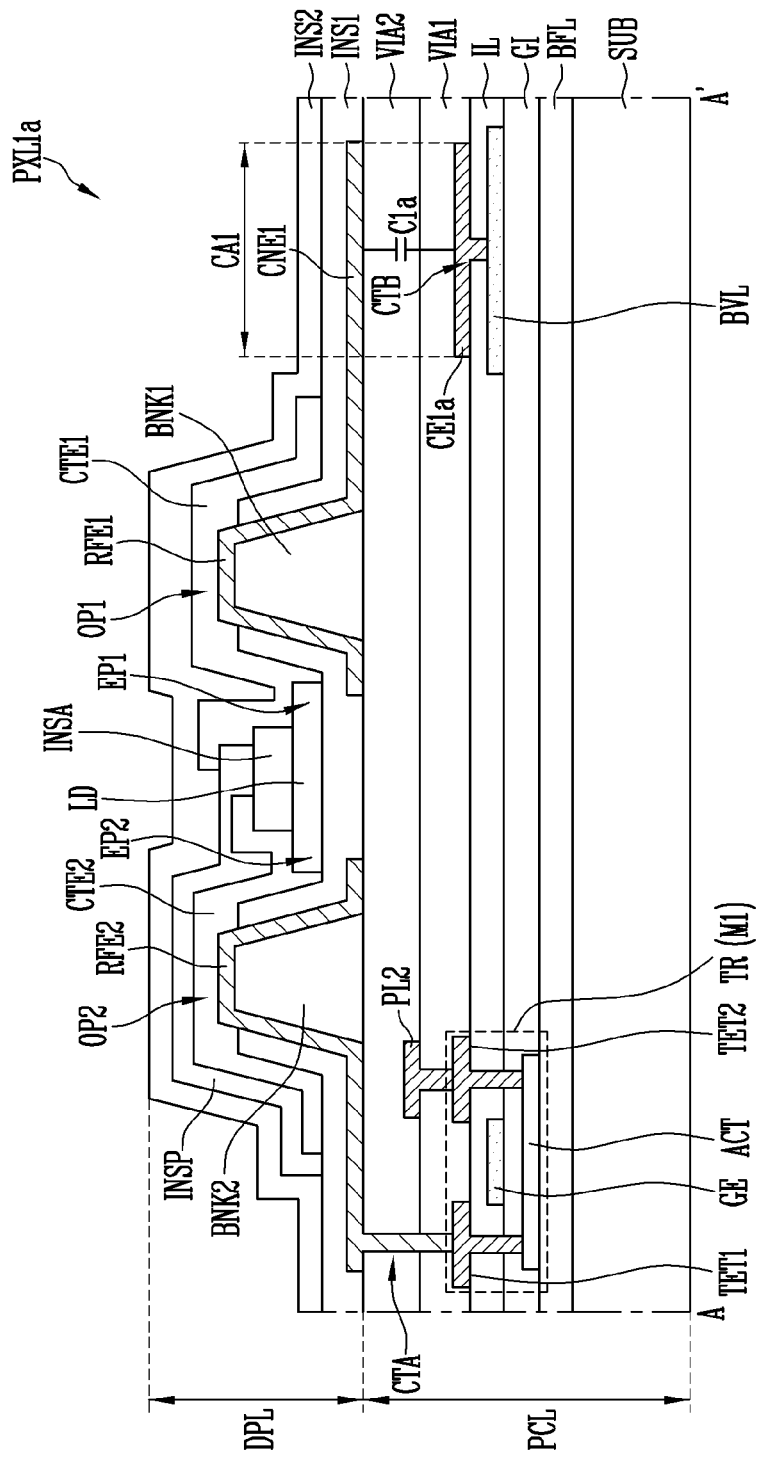
FIG. 7 to FIG. 11 illustrate schematic cross-sectional views of a pixel according to various embodiment, and illustrate schematic cross-sectional views taken along line A-A' of FIG. 5.

Both the first capacitor electrode CE1a described in the embodiment of FIG. 7 and the first capacitor electrode CE1b described in the embodiment of FIG. 8 may be applied to the following embodiments.

In the above-described embodiment, the pixel circuit layer PCL included in the pixel PXL1 is described as being disposed under or below the display element layer DPL to overlap the display element layer DPL when viewed from a cross-sectional view, but the disclosure is not limited thereto. In an embodiment, the pixel circuit layer PCL may be provided in an area for example disposed under or below the display element layer DPL but does not overlap the display element layer DPL.

The display element layer DPL will be described. The display element layer DPL may be disposed on the pixel circuit layer PCL (or the second passivation layer VIA2), and may include light emitting elements LD.

As an example, the display element layer DPL may include first and second banks BNK1 and BNK2, first and second electrodes RFE1 and RFE2, a first insulation layer INS1, a light emitting element LD, a fixing layer INSA, third and fourth electrodes CTE1 and CTE2, and a second insulation layer INS2, which are disposed on the pixel circuit layer PCL. In an embodiment, the pixel PXL1 may further include a partition wall disposed at a peripheral portion of the light emitting element LD along a boundary of the pixel.

The first bank BNK1 and the second bank BNK2 may be provided on the pixel circuit layer PCL. A space in which the light emitting element LD is disposed may be provided between the first bank BNK1 and the second bank BNK2. In the embodiment, the first bank BNK1 and the second bank BNK2 may be spaced apart from each other by more than the length of the light emitting element LD along the first direction DR1. The first bank BNK1 and the second bank BNK2 may be disposed on a same floor as each other, and may have a same height as each other, but are not limited thereto. The first bank BNK1 and the second bank BNK2 may extend along the second direction DR2 crossing or intersecting the first direction DR1.

The first bank BNK1 and the second bank BNK2 may include an organic insulation film made of an organic material or an inorganic insulation film made of an inorganic material, but the materials of the first bank BNK1 and the second bank BNK2 are not limited thereto. The first bank BNK1 and the second bank BNK2 may be formed of a single layer, but are not limited thereto, and may be formed of multiple layers. The first bank BNK1 and the second bank BNK2 may have a structure in which at least one organic insulation film and at least one inorganic insulation film may be stacked each other.

Each of the first bank BNK1 and the second bank BNK2 may have a trapezoid shape with sides inclined at an angle, but the shapes of the first bank BNK1 and the second bank BNK2 are not limited thereto, and they may have various shapes, such as semi-elliptical, circular, and quadrangular shape.

The first and second electrodes RFE1 and RFE2 may be disposed on the corresponding first and second banks BNK1 and BNK2, respectively. For example, the first electrode RFE1 may be provided on the first bank BNK1, and the second electrode RFE2 may be provided on the second bank BNK2, and they may be disposed to be spaced apart from each other. The first electrode RFE1 and the second electrode RFE2 may be spaced apart from each other by a distance along the first direction DR1. The first electrode RFE1 and the second electrode RFE2 may extend along the second direction DR2.

In case that the pixel PXL1 includes the first bank BNK1 and the second bank BNK2, the light emitting elements LD are stably disposed in a space in which the first bank BNK1 and the second bank BNK2 are spaced apart from each other, so that reliability of a display device and a yield in a manufacturing process thereof may be improved.

The first electrode RFE1 and the second electrode RFE2 may be disposed with a substantially uniform thickness along surfaces of the first bank BNK1 and the second bank BNK2, and the first electrode RFE1 and the second electrode RFE2 may be correspondingly provided to the shapes of the first bank BNK1 and the second bank BNK2. For example, the first electrode RFE1 may have a shape corresponding to a slope of the first bank BNK1, and the second electrode RFE2 may have a shape corresponding to a slope of the second bank BNK2.

The first electrode RFE1 and the second electrode RFE2 may be disposed on a same plane as each other, and may have a same height. In case that the first electrode RFE1 and the second electrode RFE2 have a same height, the light emitting element LD may be more stably connected to the first electrode RFE1 and the second electrode RFE2, respectively.

The first electrode RFE1 and the second electrode RFE2 may be made of a conductive material. The conductive material may include a metal such as Ag, Mg, Al, Pt, Pd, Au, Ni, Nd, Ir, Cr, Ti, or an alloy thereof, but is not limited thereto.

The first electrode RFE1 and the second electrode RFE2 may be formed as a single film, but is not limited thereto, and may be formed as a multi-film. For example, the first electrode RFE1 and the second electrode RFE2 may further include a capping layer (not shown) made of a transparent conductive material. The capping layer is disposed to cover or overlap the first electrode RFE1 and the second electrode RFE2, thereby preventing damage to the first and second electrodes RFE1 and RFE2 that may occur during the manufacturing process of the display device.

Here, the materials of the first electrode RFE1 and the second electrode RFE2 are not limited to the above-described materials. For example, the first electrode RFE1 and the second electrode RFE2 may include a conductive material having a constant reflectivity. In case that the first electrode RFE1 and the second electrode RFE2 are made of a conductive material having a constant reflectivity, light emitted from both end portions of the light emitting element LD are reflected by the first electrode RFE1 and the second electrode RFE2 to proceed in a display direction (for example, third direction DR3).

For example, the first electrode RFE1 and the second electrode RFE2 may have shapes corresponding to shapes of the first bank BNK1 and the second bank BNK2, and may have an angle with respect to the substrate SUB. Light emitted from both end portions of each of the light emitting elements LD may be reflected by the first electrode RFE1 and the second electrode RFE2 to further proceed in the third direction DR3. Accordingly, light output efficiency of the display device may be improved.

As shown in FIG. 5, the first electrode RFE1 may be connected to a first connection wire CNL1 through a first connection electrode CNE1. The first connection wire CNL1 may be a wire connected to the first power line PL1. Although not shown in the drawing, the first power line PL1 may be positioned on a different layer from the first connection wire CNL1 to be connected to the first connection wire CNL1 through a separate connection member.

The first power line PL1 may be connected to the first driving power source (VSS in FIG. 3A). For example, the voltage of the first driving power source VSS may be provided to the first electrode RFE1 through the first power line PL1 (or the first connection wire CNL1). The voltage of the first driving power source VSS may be provided to a first end portion EP1 of the light emitting element LD through the first electrode RFE1.

The first connection wire CNL1 may extend along the second direction DR2, and may be commonly connected to other pixels.

The first connection electrode CNE1 may be disposed along the first direction DR1 between the first electrode RFE1 and the first connection wire CNL1. At least a portion of the first connection electrode CNE1 may overlap the first capacitor electrode CE1 disposed under or below the first connection electrode CNE1.

In the embodiment, the first electrode RFE1, the first connection electrode CNE1, and the first connection wire CNL1 described above may be integral with each other, and may be simultaneously formed in a same process, but are not limited thereto.

The second electrode RFE2 may be connected to the first transistor electrode TET1 of the transistor TR through the contact hole CTA, as described above. The second electrode RFE2 may receive a driving current from the transistor TR, and may transmit the driving current to a second end portion EP2 of the light emitting element LD. The light emitting element LD may emit light of a luminance in response to a driving current (or a driving voltage) provided from the first electrode RFE1 and the second electrode RFE2.

One of the first and second electrodes RFE1 and RFE2 may be an anode electrode, and the other thereof may be a cathode electrode. For example, the first electrode RFE1 may be a cathode electrode, and the second electrode RFE2 may be an anode electrode, but the disclosure is not limited thereto.

The first insulation layer INS1 may be provided on the first electrode RFE1 and the second electrode RFE2. The first insulation layer INS1 may be entirely provided on the substrate SUB to cover or overlap the first and second banks BNK1 and BNK2 and the first and second electrodes RFE1 and RFE2, which are described above. The first insulation layer INS1 may be disposed along a surface of the substrate SUB on which the first and second banks BNK1 and BNK2 and the first and second electrodes RFE1 and RFE2 are not disposed.

In the embodiment, the first insulation layer INS1 may be an inorganic insulation layer made of an inorganic material. The first insulation layer INS1 may be disposed with a substantially uniform thickness along surfaces of the substrate SUB and the first and second electrodes RFE1 and RFE2. In the embodiment, the first insulation layer INS1 of the area in which the light emitting element LD is disposed is formed to be substantially flat, so that a space in which the light emitting element LD is stably disposed may be provided. In an embodiment, at least a partial empty space may be formed or a step may occur between the first insulation layer INS1 and the light emitting element LD disposed on the first insulation layer INS1.

The first insulation layer INS1 may include a first opening OP1 and a second opening OP2. The first opening OP1 and the second opening OP2 may expose at least a portion of the first electrode RFE1 and the second electrode RFE2.

The first and second openings OP1 and OP2 may be formed to overlap the corresponding first and second electrodes RFE1 and RFE2, respectively. For example, the first opening OP1 may be formed to overlap the first electrode RFE1, and the second opening OP2 may be formed to overlap the second electrode RFE2.

The first opening OP1 and the second opening OP2 may have a thickness and/or depth corresponding to a thickness of the first insulation layer INS1. For example, the first opening OP1 and the second opening OP2 may completely penetrate the first insulation layer INS1 in the corresponding area. Accordingly, the first and second electrodes RFE1 and RFE2 may be exposed to the outside to contact the third and fourth electrodes CTE1 and CTE2, which will be described later.

The light emitting element LD may be disposed on the first insulation layer INS1. The light emitting element LD may be disposed in a space provided by the first bank BNK1 and the second bank BNK2, and may be electrically connected between the first electrode RFE1 and the second electrode RFE2. For example, the first end portion EP1 of the light emitting element LD may be electrically connected to the first electrode RFE1, and the second end portion EP2 of the light emitting element LD may be electrically connected to the second electrode RFE2.

The fixing layer INSA for stably supporting and fixing the light emitting elements LD may be disposed on the light emitting elements LD. The fixing layer INSA may be an inorganic insulation film including an inorganic material or an organic insulation film including an organic material. The fixing layer INSA may be disposed to fill a space between the light emitting element LD and the second passivation layer VIA2. The fixing layer INSA may cover or overlap at least a portion of an outer circumferential surface of each of the light emitting elements LD, and may be formed to expose the first end portion EP1 and the second end portion EP2 of the light emitting elements LD. Accordingly, the fixing layer INSA stably supports and fixes the light emitting elements LD, thereby preventing the light emitting elements LD from being separated from the display element layer DPL. The fixing layer INSA may be omitted depending on process conditions of the display element layer DPL.

Figure 9:
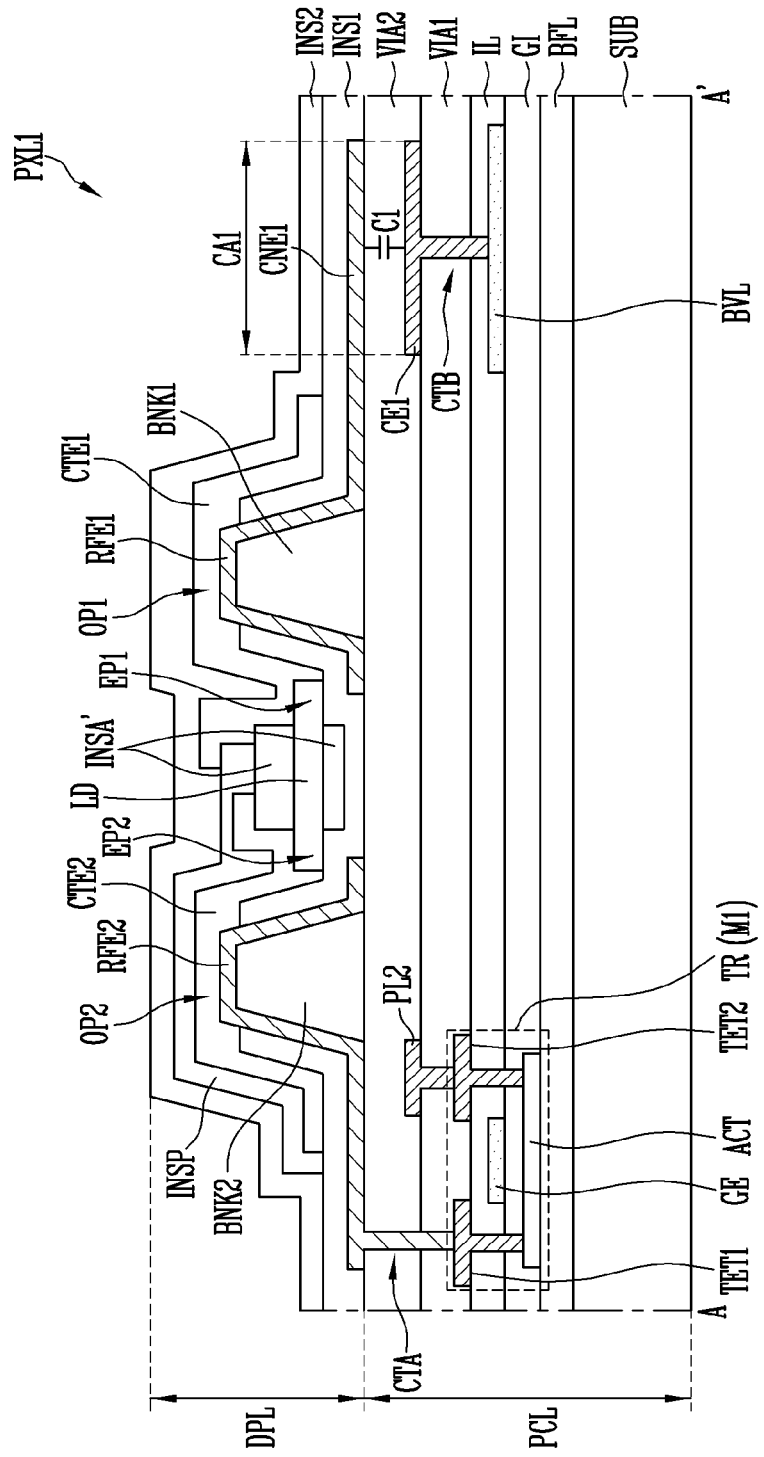
Figure 10:
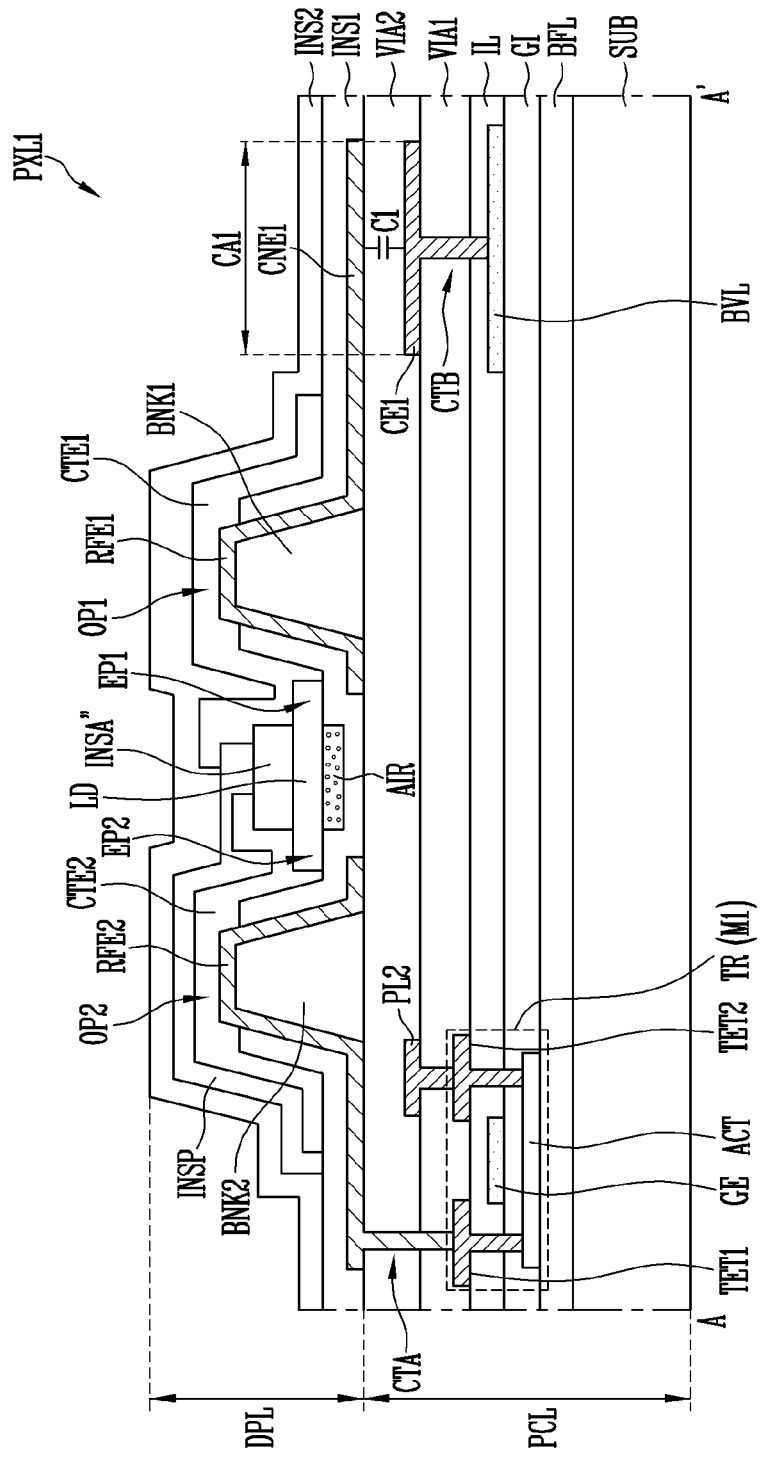

In an embodiment, in case that the fixing layer INSA includes an organic insulation film made of an organic material and in case that an empty space is formed between the light emitting element LD and the first insulation layer INS1, as shown in FIG. 9, a fixing layer INSA' may fill the space between the light emitting element LD and the first insulation layer INS1, and may support the light emitting element LD. By way of example, in case that the fixing layer INSA includes an inorganic insulation film made of an inorganic material, as shown in FIG. 10, a fixing layer INSA" may cover or overlap at least a portion of the outer circumferential surface of the light emitting element LD, and an air layer AIR may be at least partially formed between the light emitting element LD and the insulation layer INSL.

The third electrode CTE1 (or first contact electrode) and the fourth electrode CTE2 (or second contact electrode) may be provided on the first insulation layer INS1, the light emitting element LD, and the fixing layer INSA. An insulation pattern INSP may be provided between the third electrode CTE1 and the fourth electrode CTE2.

The third electrode CTE1 and the fourth electrode CTE2 may contact one of both end portions of each light emitting element LD. For example, the third electrode CTE1 may contact the first end portion EP1 of each light emitting element LD, and the fourth electrode CTE2 may contact the second end portion EP2 of each light emitting element LD.

The third electrode CTE1 may cover or overlap the first electrode RFE1 and overlap the first electrode RFE1 in a plan view. The third electrode CTE1 may be electrically connected to the first electrode RFE1 through the first opening OP1 of the first insulation layer INS1. For example, the third electrode CTE1 may contact the first end portion EP1 of the light emitting element LD and the first electrode RFE1.

The fourth electrode CTE2 may cover or overlap the second electrode RFE2 and overlap the second electrode RFE2 when viewed in a plan view. The fourth electrode CTE2 may be electrically connected to the second electrode RFE2 through the second opening OP2 of the first insulation layer INS1. For example, the fourth electrode CTE2 may contact the second end portion EP2 of the light emitting element LD and the second electrode RFE2.

Each of the third and fourth electrodes CTE1 and CTE2 may be made of a transparent conductive material. For example, the transparent conductive material may include an indium tin oxide (ITO), an indium zinc oxide (IZO), an indium tin-zinc oxide (ITZO), or the like within the spirit and the scope of the disclosure. In case that the third and fourth electrodes CTE1 and CTE2 are made of a transparent conductive material, light loss may be reduced in case that light emitted from the light emitting element LD proceeds in the third direction DR3. The materials of the third and fourth electrodes CTE1 and CTE2 are not limited to the above-described materials.

The insulation pattern INSP may be disposed between the third and fourth electrodes CTE1 and CTE2. As an example, the insulation pattern INSP may include an inorganic insulation film made of an inorganic material. The insulation pattern INSP may be disposed to cover or overlap one of the third electrode CTE1 and the fourth electrode CTE2, and the other electrode may be disposed on the insulation pattern INSP. For example, the insulation pattern INSP may be disposed on the fourth electrode CTE2 to cover or overlap the fourth electrode CTE2, and the third electrode CTE1 may be disposed on the insulation pattern INSP. For example, the third electrode CTE1 and the fourth electrode CTE2 may be electrically separated by an insulation pattern INSP.

Figure 11:
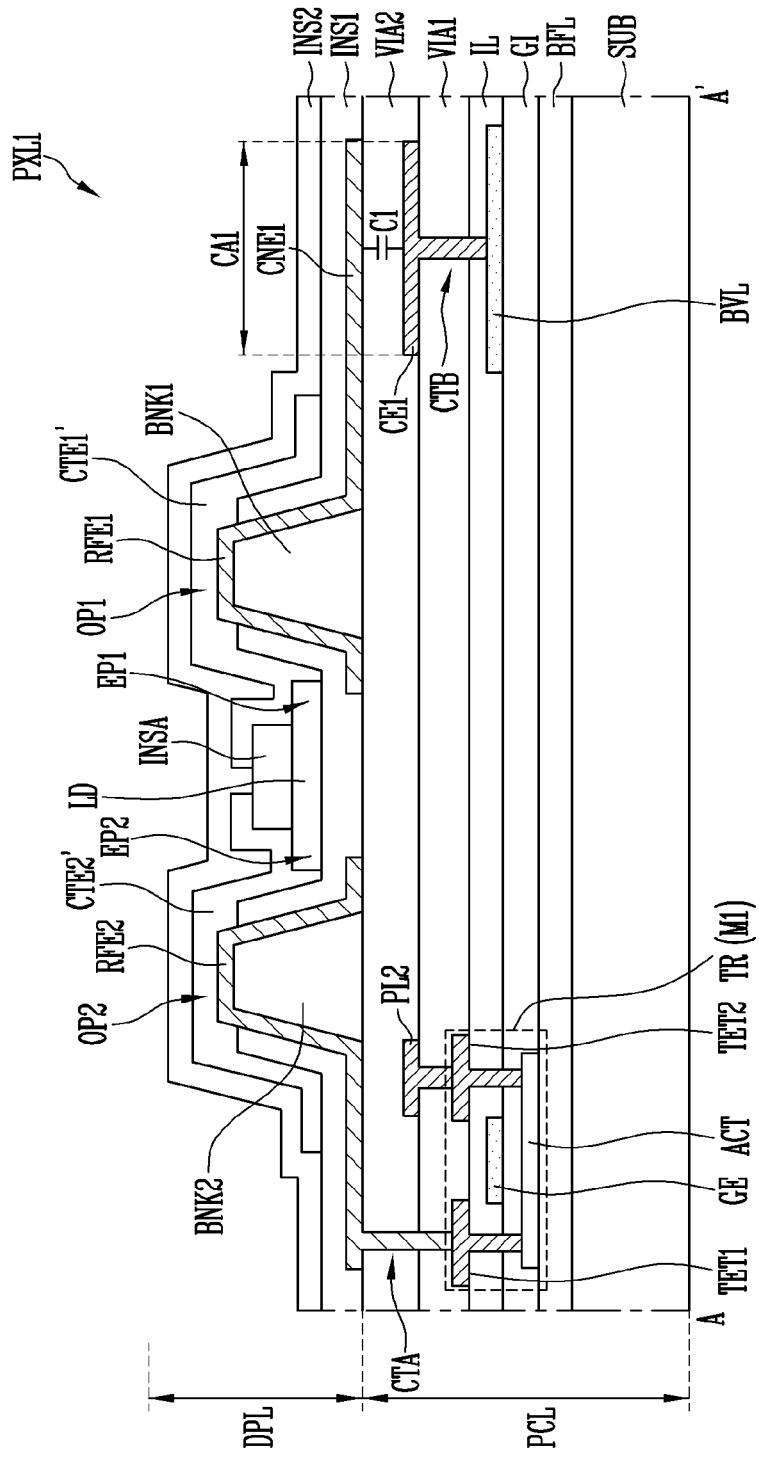

However, the disposition of the third and fourth electrodes CTE1 and CTE2 is not limited thereto, and the third and fourth electrodes CTE1 and CTE2 may be disposed on a same layer. For example, as shown in FIG. 11, the insulation pattern INSP may not be disposed between a third electrode CTE1' and a fourth electrode CTE2'. The third electrode CTE1' and the fourth electrode CTE2' may be formed on a same layer. In case that the third electrode CTE1' and the fourth electrode CTE2' are simultaneously formed, the manufacturing process of the display device is simplified, and the manufacturing cost thereof may be reduced.

The second insulation layer INS2 may be disposed on the third and fourth electrodes CTE1 and CTE2. The second insulation layer INS2 may be formed on an outermost of the display element layer DPL to cover or overlap other components of the display element layer DPL. The second insulation layer INS2 may also serve as an encapsulation layer that may prevent the first to fourth electrodes RFE1, RFE2, CTE1, and CTE2 and the light emitting element LD from being damaged during the manufacturing process of the display device and may prevent oxygen and/or moisture from penetrating into the inside of the display element layer DPL.

The second insulation layer INS2 may be formed as an inorganic insulation film including an inorganic material. The second insulation layer INS2 may be formed as a single layer, but is not limited thereto, and may have a multi-layered structure. In case that the second insulation layer INS2 has a multi-layered structure, it may further include an organic insulation film including an organic material, and may have a multi-layered structure in which the organic insulation film and the inorganic insulation film are alternately disposed.

Although not shown in the drawing, in an embodiment, a planarization layer (not shown) may be further provided on the second insulation layer INS2. The planarization layer may alleviate a step caused by the various configurations disposed thereunder. The planarization layer may include an organic insulation film, but is not limited thereto, and may further include an inorganic insulation film.

Although not shown in the drawing, the pixel PXL1 may further include a partition wall disposed around the light emitting element LD. For example, the partition wall may be disposed to surround the pixel PXL1. The partition wall may be a pixel defining film defining the light emitting area EA of the pixel PXL1. The partition wall may be formed to include at least one light blocking material and/or reflective material to prevent a light leakage defect in which light leaks between adjacent pixels. The partition wall may prevent a solution including the light emitting element LD from leaking to adjacent pixels during the process of aligning the light emitting element LD. The partition wall may be omitted depending on process conditions of the display device.

Figure 12:
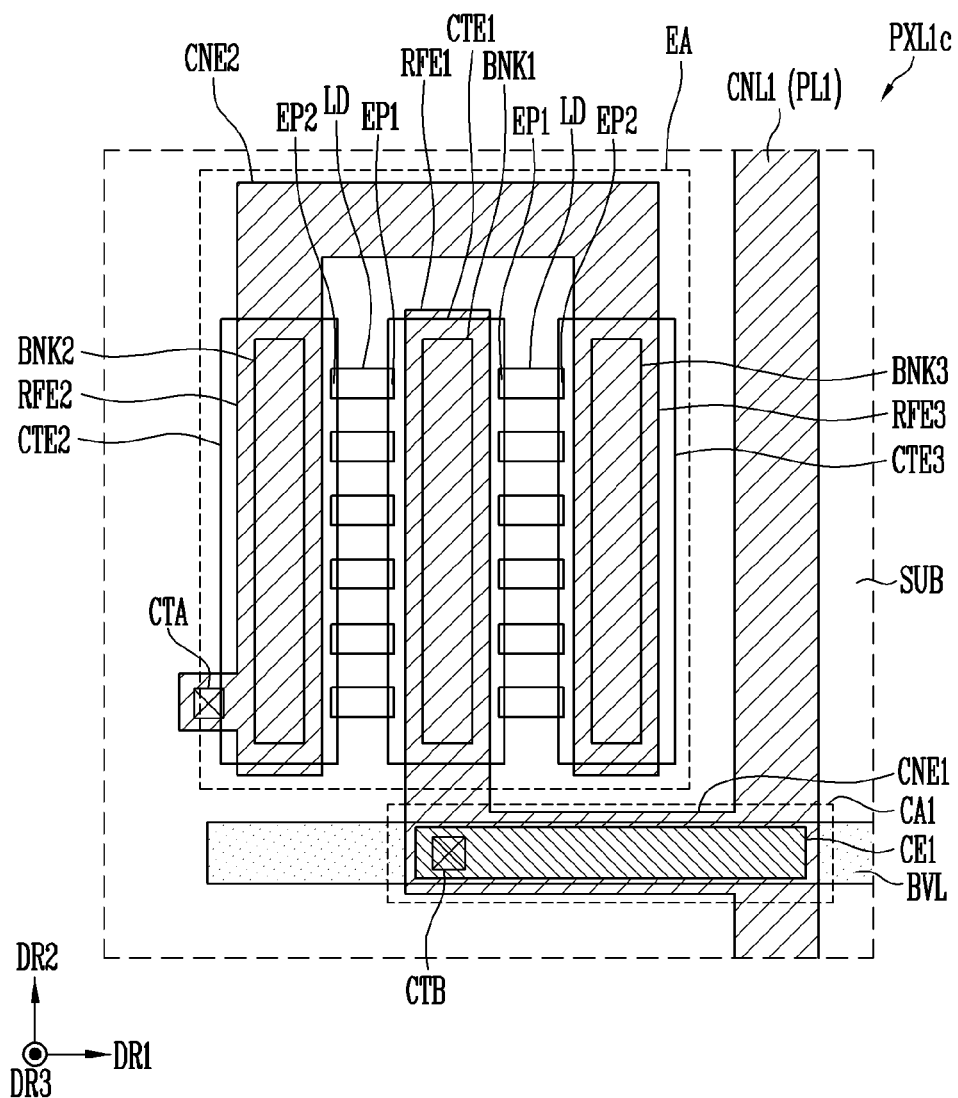
FIG. 12 illustrates a schematic top plan view of a pixel according to an embodiment.

FIG. 12 illustrates a schematic top plan view of a pixel according to an embodiment. Compared with the above-described embodiment, an embodiment of FIG. 12 may be different in that it may further include a fifth electrode RFE3 connected to the second electrode RFE2, and other configurations are substantially the same or similar, so differences will be described.

Referring to FIG. 5, FIG. 6, and FIG. 12, a pixel PXL1c may include a third bank BNK3, the fifth electrode RFE3, and a sixth electrode CTE3.

The third bank BNK3 may be positioned between the first electrode RFE1 and the first connection wire CNL1. The third bank BNK3 may be disposed on a same layer as the first bank BNK1 and the second bank BNK2, and may be simultaneously formed therewith. The third bank BNK3 may be formed to have a same shape and height as the first bank BNK1 and the second bank BNK2. The third bank BNK3 may be formed to be spaced apart from the first bank BNK1 in the first direction DR1 by more than the length of the light emitting element LD, and may extend along the second direction DR2.

The fifth electrode RFE3 may be formed to overlap the third bank BNK3. The fifth electrode RFE3 may be positioned between the first electrode RFE1 and the first connection wire CNL1. The fifth electrode RFE3 may be formed to be spaced apart from the first electrode RFE1 in the first direction DR1, and may extend along the second direction DR2.

The fifth electrode RFE3 may be connected to the second electrode RFE2 through the second connection electrode CNE2. The second connection electrode CNE2 may extend along the first direction DR1 between the first electrode RFE1 and the fifth electrode RFE3.

The second electrode RFE2, the fifth electrode RFE3, and the second connection electrode CNE2 may be simultaneously formed, but may be integral with each other, but are not limited thereto. At least one of the second electrode RFE2, the fifth electrode RFE3, and the second connection electrode CNE2 may be simultaneously formed with at least one of the first electrode RFE1, the first connection wire CNL1, and the first connection electrode CNE1, but is not limited thereto. In the embodiment, the first electrode RFE1, the second electrode RFE2, the fifth electrode RFE3, the first connection electrode CNE1, the second connection electrode CNE2, and the first connection wire CNL1 may all be simultaneously formed in a same process.

The light emitting elements LD may be disposed between the first electrode RFE1 and the fifth electrode RFE3. The first end portion EP1 of the light emitting elements LD may be electrically connected to the first electrode RFE1, and the second end portion EP2 thereof may be electrically connected to the fifth electrode RFE3.

The sixth electrode CTE3 may be disposed on the fifth electrode RFE3. The sixth electrode CTE3 may cover or overlap the fifth electrode RFE3 and may overlap the fifth electrode RFE3, in a plan view. The sixth electrode CTE3 may contact the second end portion EP2 of the light emitting element LD and the fifth electrode RFE3.

The sixth electrode CTE3 may be formed on a same layer as at least one of the third electrode CTE1 and the fourth electrode CTE2. The sixth electrode CTE3 may be made of a same material or a similar material as the third electrode CTE1 and the fourth electrode CTE2.

As described above, in case that the fifth electrode RFE3 is further disposed between the first electrode RFE1 and the first connection wire CNL1, the light emitting elements LD may also be disposed between the first electrode RFE1 and the fifth electrode RFE3. For example, since a larger number of light emitting elements LD may be disposed in one pixel PXL1c, display luminance of the display device including the pixel PXL1c according to an embodiment may be improved.

In an embodiment, the structure in which only the fifth electrode RFE3 is further disposed is described as an example, but in an embodiment, in addition to the fifth electrode RFE3, other electrodes connected to the first electrode RFE1 and the second electrode RFE2 may be further formed to further provide a space in which the light emitting elements LD may be disposed.

FIG. 13 to FIG. 16 illustrate schematic top plan views for explaining a manufacturing method of a display device according to an embodiment. FIG. 17 illustrates a circuit diagram for explaining a noise removing method of voltages supplied to a display device according to an embodiment in case that a light emitting element is aligned. FIG. 18 illustrates waveform diagrams of voltages actually supplied to respective electrodes of a display device according to an embodiment in case that a light emitting element is aligned. For example, FIG. 18 illustrates a first waveform 1, a second waveform 2 and a third waveform 3. For example, FIG. 13 to FIG. 18 are drawings for explaining a method of aligning light emitting elements in the structure illustrated in FIG. 5 and FIG. 6.

A manufacturing method of a display device according to an embodiment will be schematically described by combining an embodiment described in FIG. 5 and FIG. 6 and FIG. 13 to FIG. 18.

Figure 13:
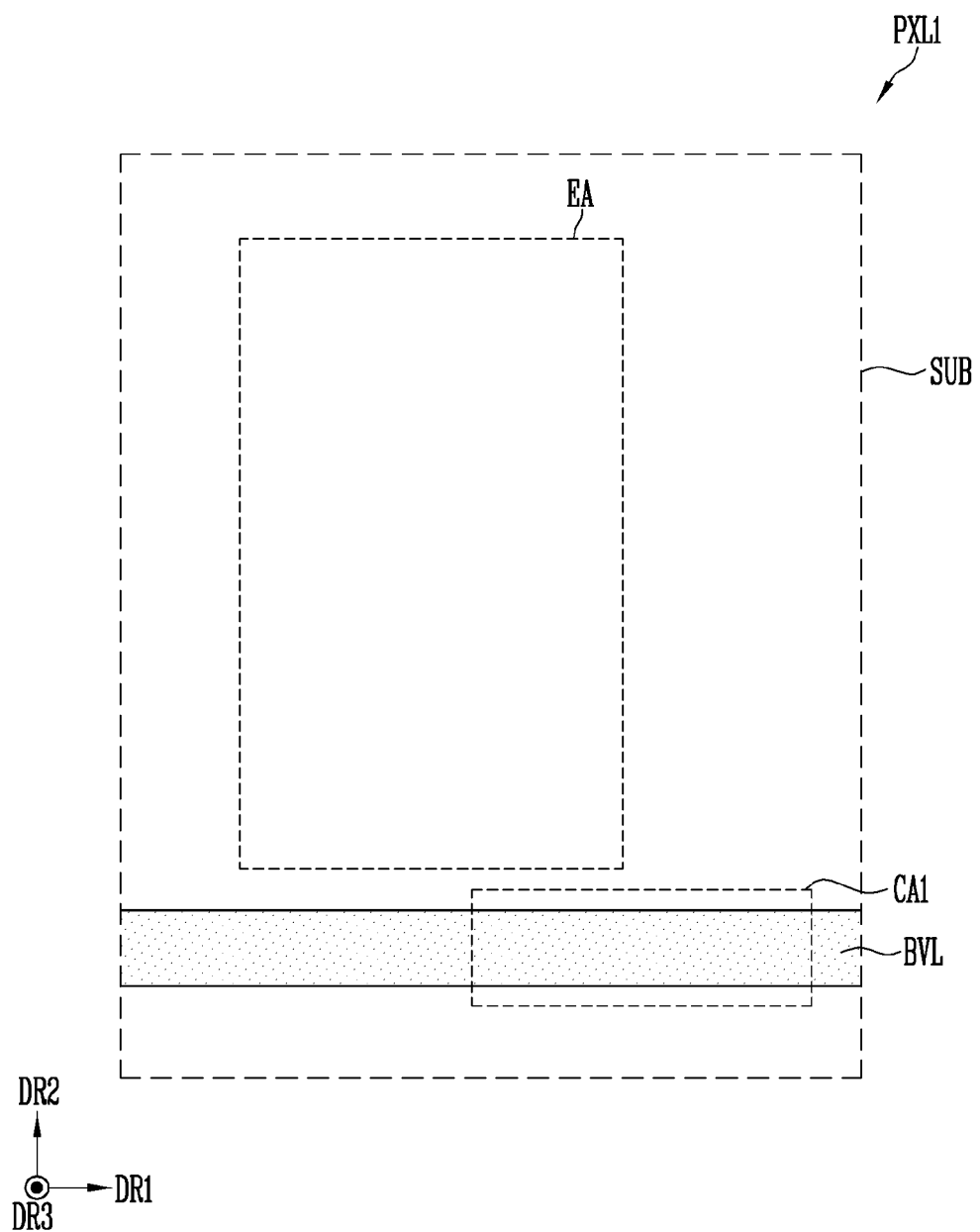
FIG. 13 to FIG. 16 illustrate schematic top plan views for explaining a manufacturing method of a display device according to an embodiment.

First, as shown in FIG. 13, the bypass power line BVL may be formed on the substrate SUB.

The bypass power line BVL may be formed in an area that does not overlap the light emitting area EA in which the light emitting elements LD will be disposed later. The bypass power line BVL may be formed to extend along the first direction DR1, and may extend to be connected to other pixels.

Figure 14:
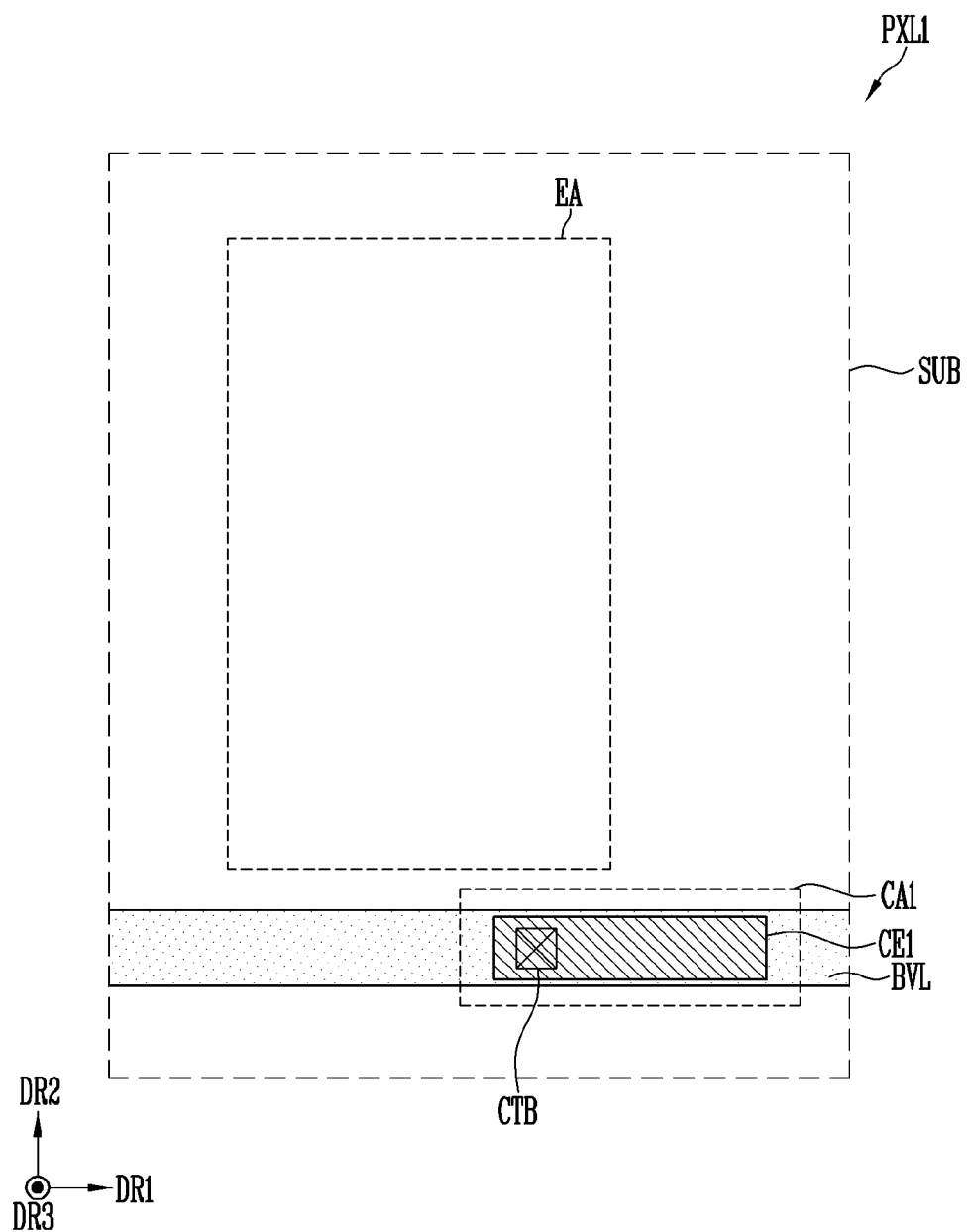

As shown in FIG. 14, the first capacitor electrode CE1 may be formed on the substrate SUB on which the bypass power line BVL is formed.

The first capacitor electrode CE1 may be formed on an upper portion (for example, in the third direction DR3) of the bypass power line BVL. At least a portion of the first capacitor electrode CE1 may overlap the bypass power line BVL. The first capacitor electrode CE1 may also be disposed so as to not overlap the light emitting area EA.

The first capacitor electrode CE1 may be electrically connected to the bypass power line BVL through the contact hole CTB. Accordingly, the bypass power line BVL may transmit a transmitted voltage to the first capacitor electrode CE1 through the contact hole CTB.

Figure 15:
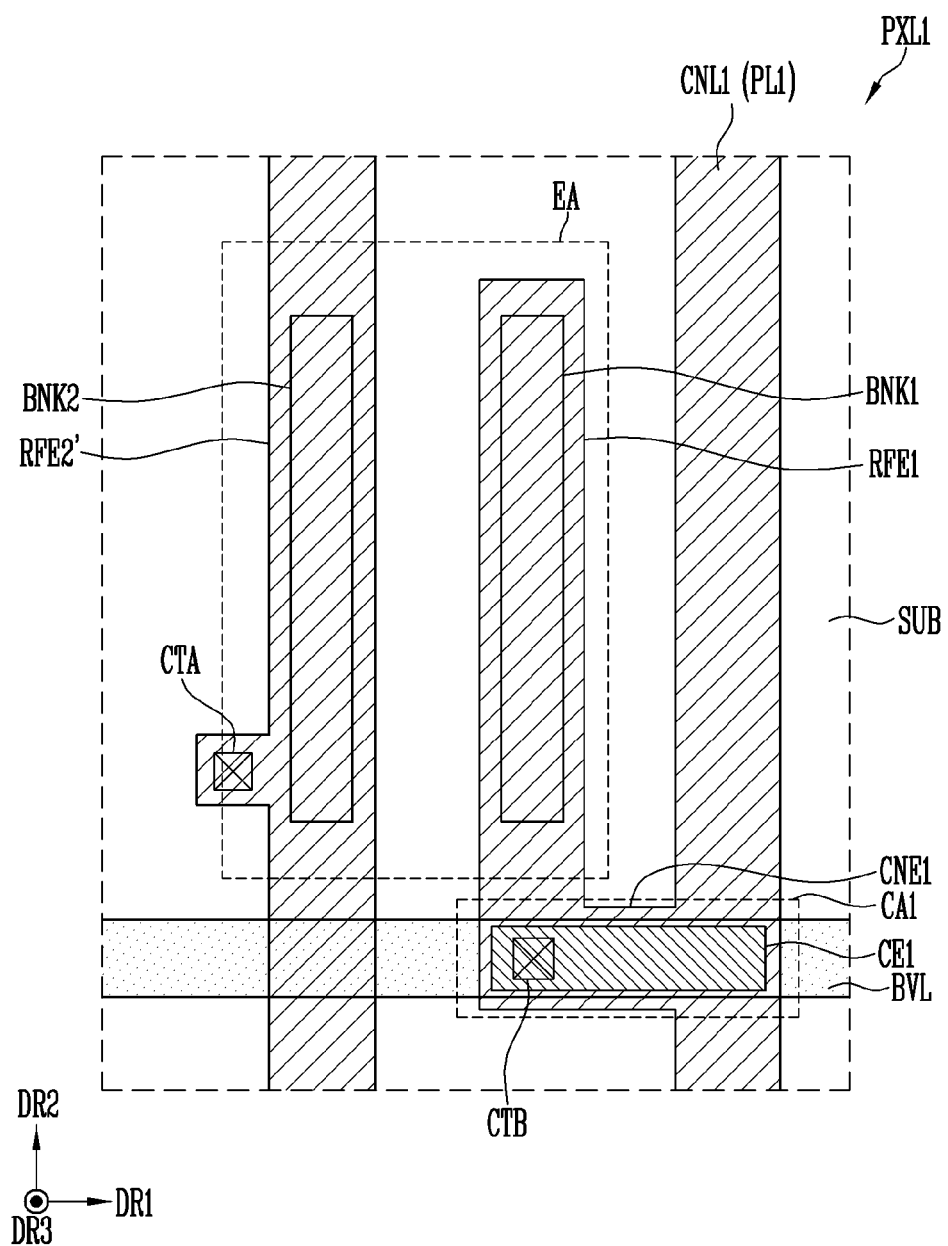

As shown in FIG. 15, the first bank BNK1 and the second bank BNK2 may be formed, and the first connection wire CNL1, the first electrode RFE1 connected to the first connection wire CNL1, and a base electrode RFE2' spaced apart from the first electrode RFE1 may be formed, on the substrate SUB on which the first capacitor electrode CE1 is formed.

The first bank BNK1 and the second bank BNK2 may be formed in the light emitting area EA, and may be spaced apart from each other by a distance along the first direction DR1 to provide a space in which the light emitting elements LD will be disposed later.

The first connection wire CNL1 may extend in a direction crossing or intersecting the bypass power line BVL. For example, the first connection wire CNL1 may extend along the second direction DR2.

The first electrode RFE1 may be formed to overlap the first bank BNK1. The first electrode RFE1 may be connected to the first connection wire CNL1 through the first connection electrode CNE1. The first connection electrode CNE1 may be formed at a position overlapping the first capacitor electrode CE1. Accordingly, in the first capacitor area CA1, the first capacitor electrode CE1 and the first connection electrode CNE1 (or first electrode RFE1) may form a capacitor.

The base electrode RFE2' may be formed to overlap the second bank BNK2. The base electrode RFE2' may be formed to be spaced apart from the first electrode RFE1 along an opposite direction of the first direction DR1, and may be formed to extend along the second direction DR2. The base electrode RFE2' may extend to be connected to other pixels along the second direction DR2.

The base electrode RFE2' may be a base conductive layer before forming the second electrode RFE2. The base electrode RFE2' may be separated after an alignment process of the light emitting elements LD to form the second electrode RFE2.

Figure 16:
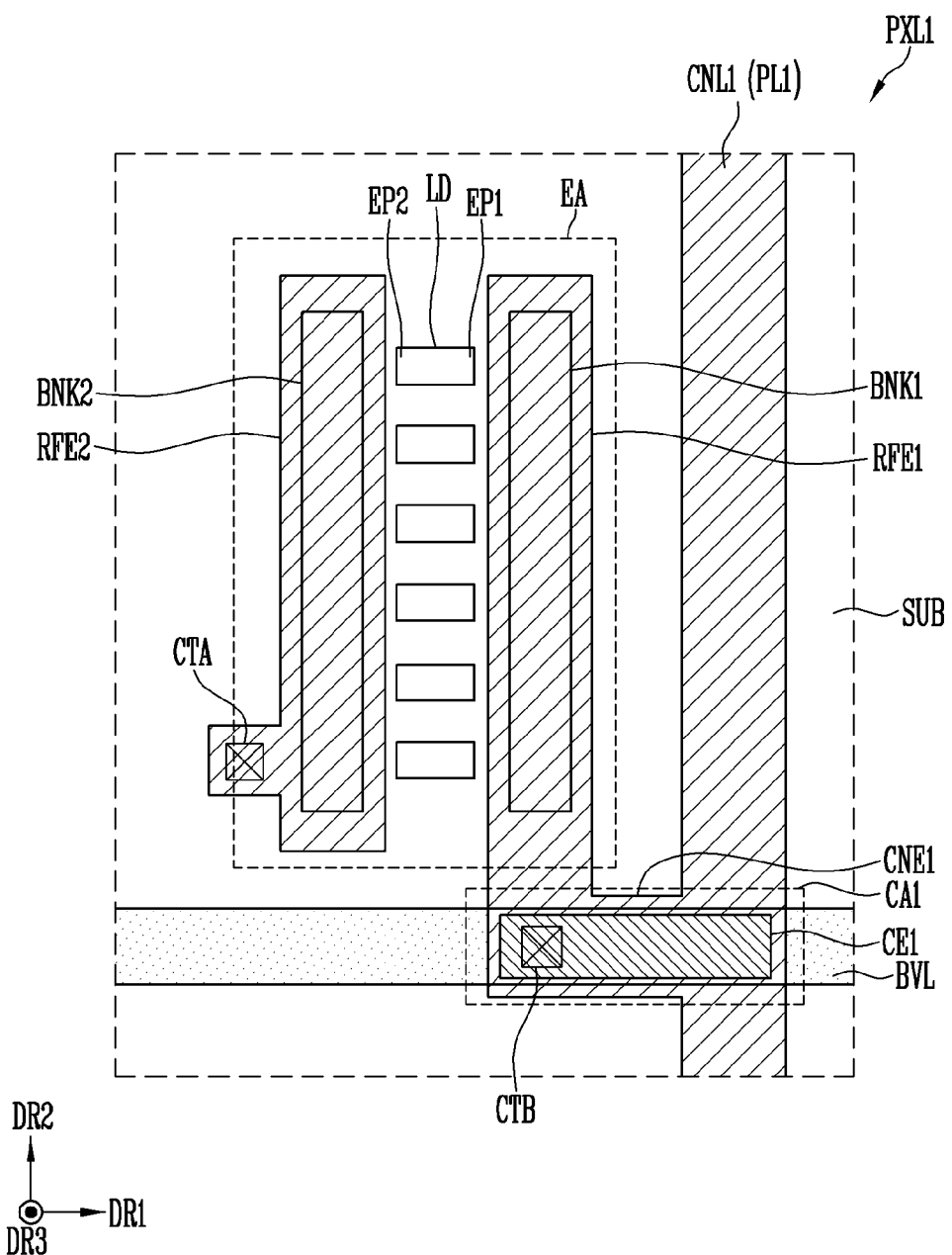
Figure 17:
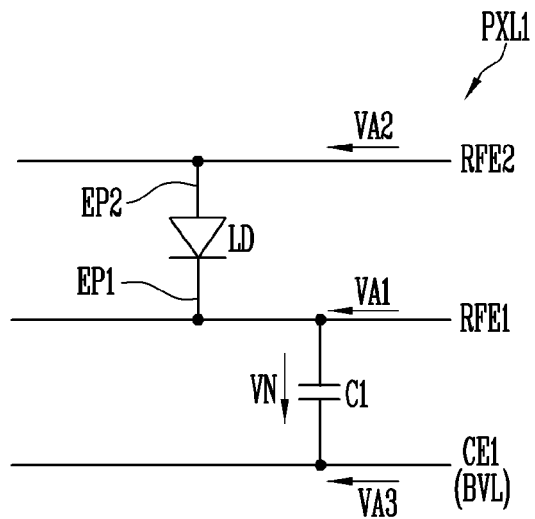
FIG. 17 illustrates a circuit diagram for explaining a noise removing method of voltages supplied to a display device according to an embodiment in case that a light emitting element is aligned.
Figure 18:
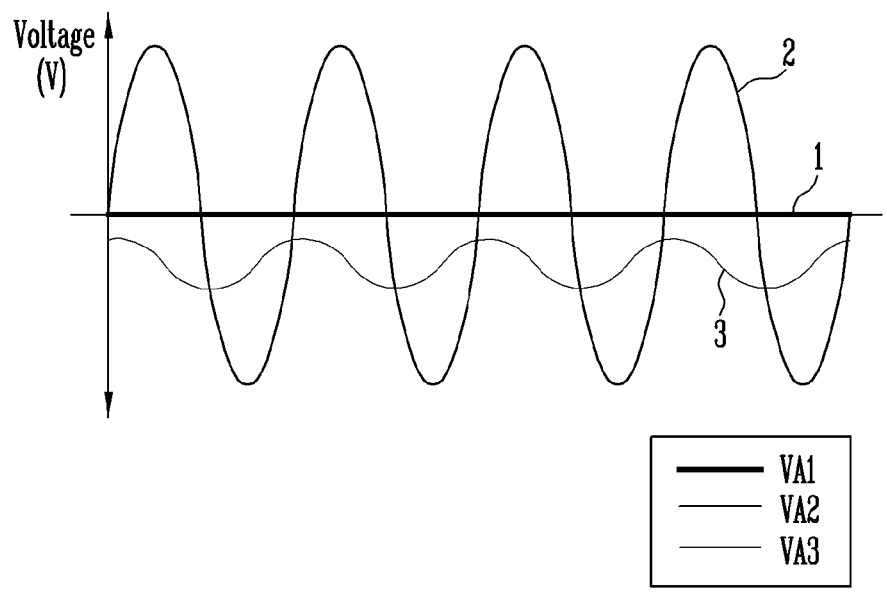
FIG. 18 illustrates waveform diagrams of voltages actually supplied to respective electrodes of a display device according to an embodiment in case that a light emitting element is aligned.

As shown in FIG. 16 and FIG. 17, the light emitting elements LD may be aligned between the first electrode RFE1 and the second electrode RFE2.

An electric field is formed between the first electrode RFE1 and the second electrode RFE2, and accordingly, the light emitting elements LD may be aligned between the first electrode RFE1 and the second electrode RFE2.

As an example, the first electrode RFE1 may be connected to the first connection wire CNL1 to receive a first voltage VA1. The first voltage VA1 may be a ground voltage provided through the ground voltage wires GNDL1 and GNDL2 described with reference to FIG. 2. The second electrode RFE2 (or base electrode RFE2') may receive a second voltage VA2. The second voltage VA2 may be an alternating current voltage provided through the alternating current voltage wires ACL1 and ACL2 described with reference to FIG. 2. For example, as a ground voltage is applied to the first electrode RFE1 and an AC voltage is applied to the second electrode RFE2, an electric field may be formed between the first electrode RFE1 and the second electrode RFE2.

The light emitting elements LD may be prepared in a dispersed form in a solution, and may be supplied into the light emitting area EA of the pixel PXL by using an inkjet method or the like within the spirit and the scope of the disclosure. For example, the light emitting elements LD may be mixed with a volatile solvent to be dropped into the light emitting area EA. The light emitting elements LD dropped into the light emitting area EA may be self-aligned by the electric field formed between the first electrode RFE1 and the second electrode RFE2 to be disposed to have a certain or given directionality. For example, the first end portion EP1 of the light emitting elements LD is disposed to be adjacent to the first electrode RFE1, and the second end portion EP2 is disposed to be adjacent to the second electrode RFE2, so that the light emitting element LD may be disposed for the length direction thereof to be parallel to the first direction DR1. These light emitting elements LD may be arranged or disposed along the second direction DR2.

The alignment wire (for example, ground voltage wires GNDL1 and GNDL2 in FIG. 2) connected to the first electrode RFE1 and the alignment wire (for example, alternating current voltage wires ACL1 and ACL2) connected to the second electrode RFE2 may overlap each other in at least a partial area.

For example, as shown in FIG. 2, the branch wire of the first alternating current voltage wire ACL1 extends toward the display area DA, and may overlap the main wire of the second ground voltage wire GNDL2 in at least a partial area. The area in which the ground voltage wire and the alternating current voltage wire overlap forms a capacitor, and voltage coupling may occur therein.

For example, in the process of aligning the light emitting elements LD, the first voltage VA1 that is a direct current voltage (or a ground voltage) may be applied to the first electrode RFE1, and the second voltage VA2 that is an alternating current voltage may be applied to the second electrode RFE2, but due to a coupling phenomenon between the wires described above, a noise component may be included in the direct current voltage (or the ground voltage) provided to the first electrode RFE1.

In the display device according to an embodiment, the first capacitor C1 may be formed by using the first electrode RFE1 and the first capacitor electrode CE1, and the third voltage VA3 different from the first voltage VA1 is applied to the first capacitor electrode CE1, so that a noise component voltage VN (or alternating current voltage component) of the voltage supplied to the first electrode RFE1 may be bypassed toward the first capacitor electrode CE1 through the first capacitor C1. Accordingly, the noise component voltage VN of the voltage provided to the first electrode RFE1 may be removed, and a uniform direct current voltage (or ground voltage) may be provided as in a first waveform 1 of FIG. 18.

Here, the third voltage VA3 supplied to the bypass power line BVL may be a direct current voltage like the first voltage VA1 supplied to the first electrode RFE1. However, a voltage level of the third voltage VA3 and a voltage level of the first voltage VA1 may be different from each other. As an example, the third voltage VA3 may be a value between a positive peak voltage and a negative peak voltage of the second voltage VA2. For example, in case that the first voltage VA1 is the ground voltage and the peak voltages of the second voltage VA2 are −10 V and 10 V, the third voltage VA3 may be 3 V or −3 V. However, these voltage values are only an example of an embodiment, and the voltage values of the first to third voltages VA1, VA2, and VA3 are not limited thereto.

As described above, in case that the light emitting element LD is aligned during the manufacturing process of the display device, the noise (for example, the noise component voltage VN) of the first voltage VA1 supplied to the second electrode of the light emitting element LD by the first capacitor C1 may be removed or minimized. For example, in the alignment process of the light emitting element LD, a constant direct current voltage (or ground voltage) is applied to the first electrode RFE1 as shown in the first waveform 1 of FIG. 18, and the noise component voltage VN may be bypassed toward the first capacitor electrode CE1 (or bypass power line BVL) (see a third waveform 3 in FIG. 18).

Therefore, a uniform electric field may be formed between the first electrode RFE1 and the second electrode RFE2. Accordingly, the light emitting elements LD may be readily aligned between the first electrode RFE1 and the second electrode RFE2. For example, the alignment characteristic of the light emitting elements LD may be improved. As the light emitting elements LD are uniformly aligned in respective pixels, the display quality and manufacturing efficiency of the display device may be improved.

Hereinafter, other embodiments of a pixel and a display device including the same will be described. In the following embodiments, the same or similar components as those in the previously described embodiment are denoted by the same reference numerals, and descriptions thereof will be omitted or simplified, and differences will be described.

Figure 19:
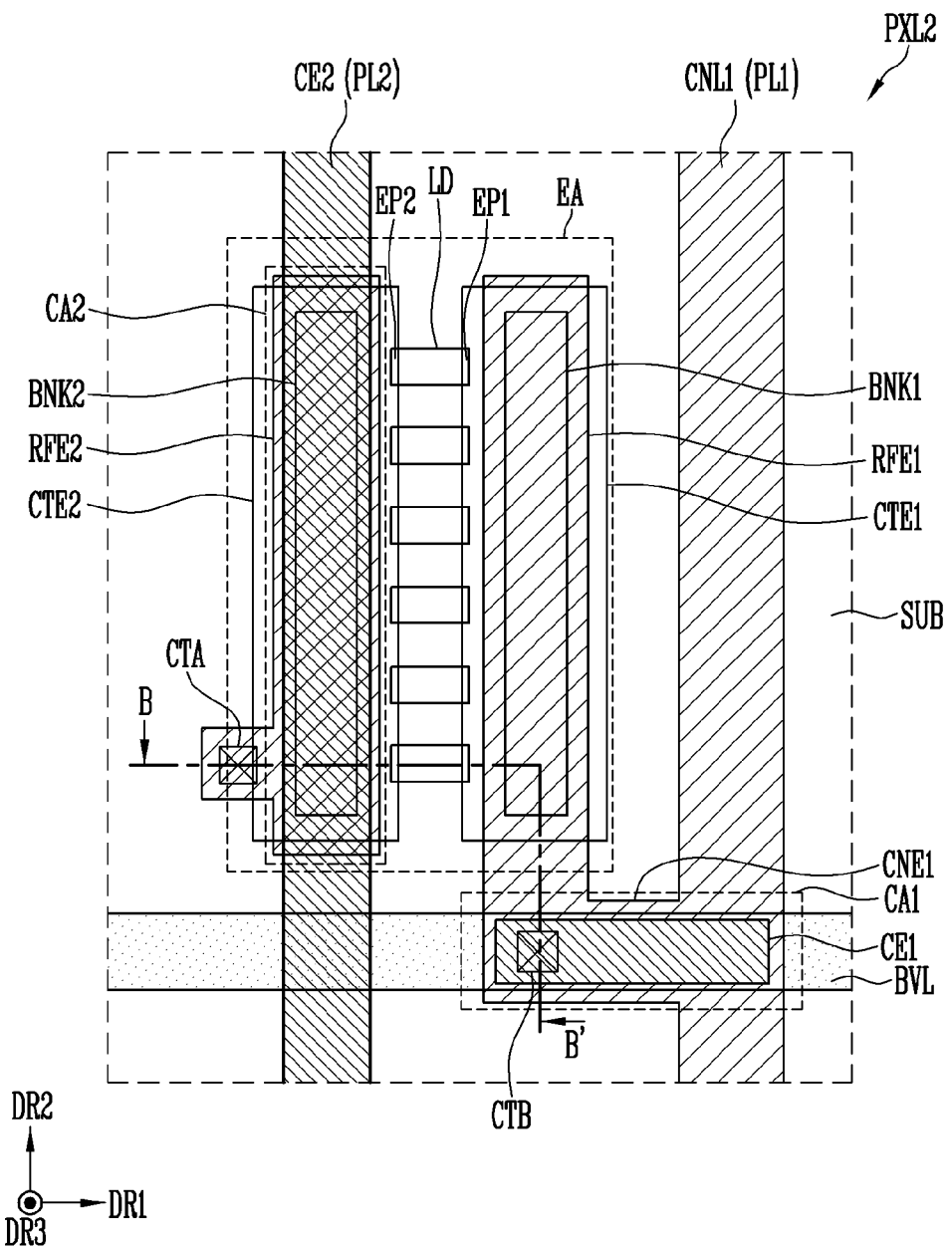
FIG. 19 illustrates a schematic top plan view of a pixel according to an embodiment.
Figure 20:
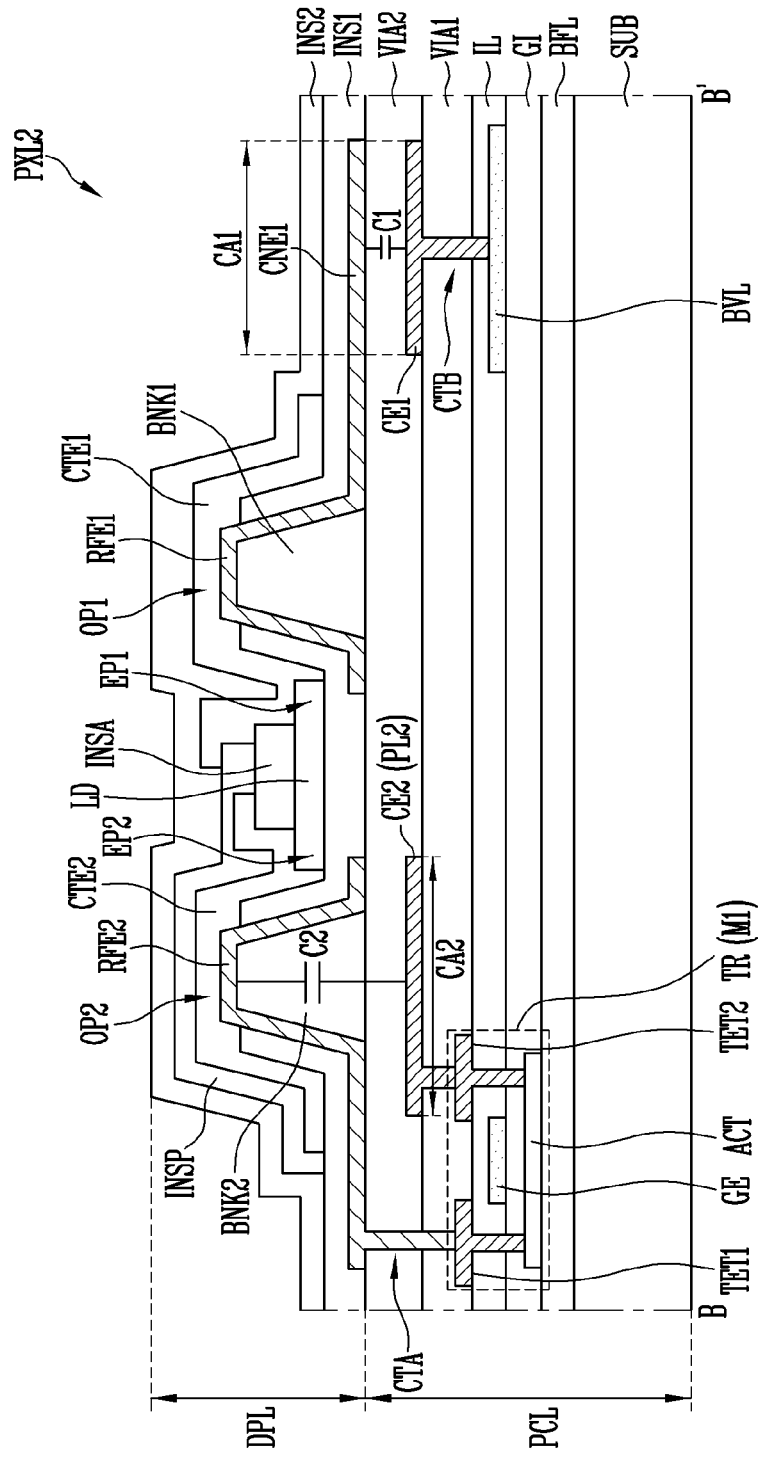
FIG. 20 illustrates a schematic cross-sectional view taken along line B-B' of FIG. 19.
Figure 21:
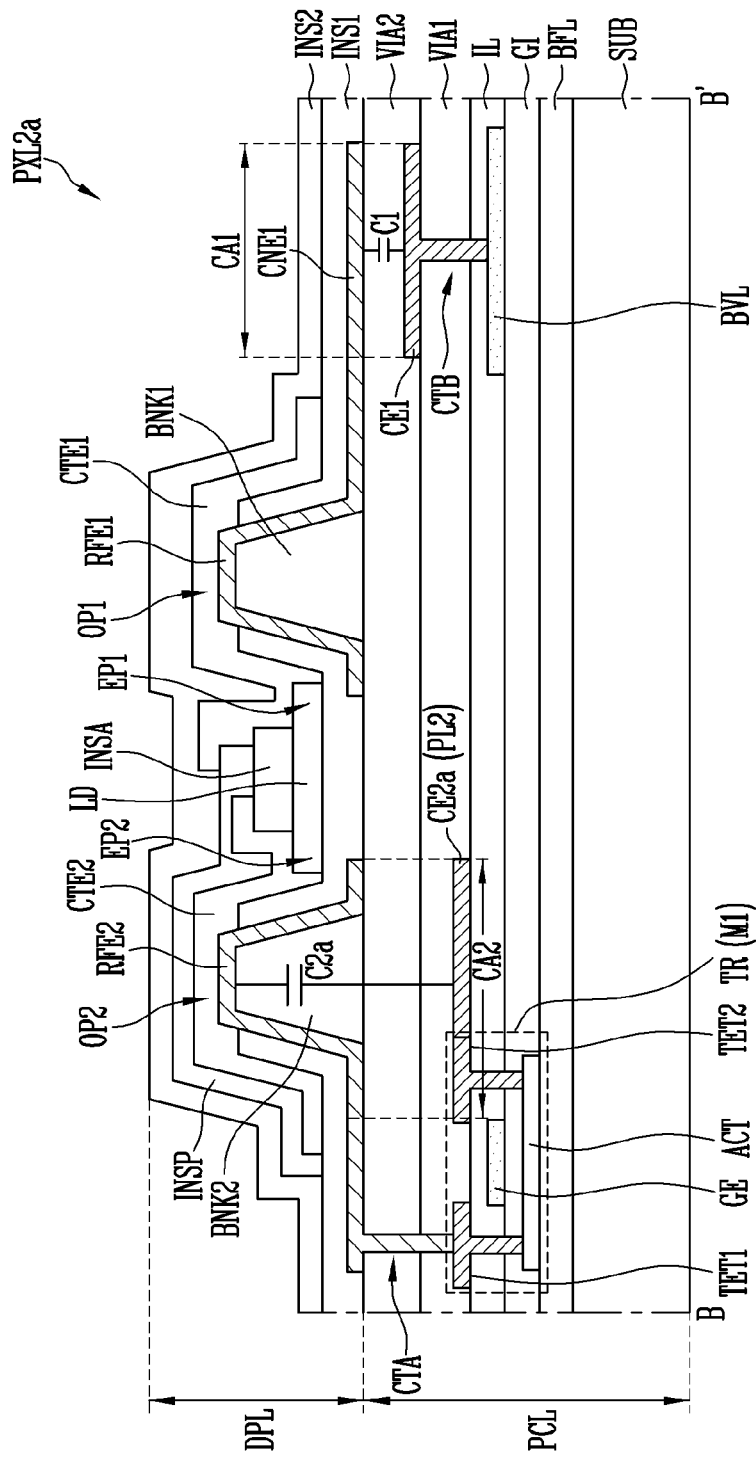
FIG. 21 illustrates a schematic cross-sectional view of a pixel according to an embodiment, and illustrates a schematic cross-sectional view taken along line B-B' of FIG. 19.
Figure 22:
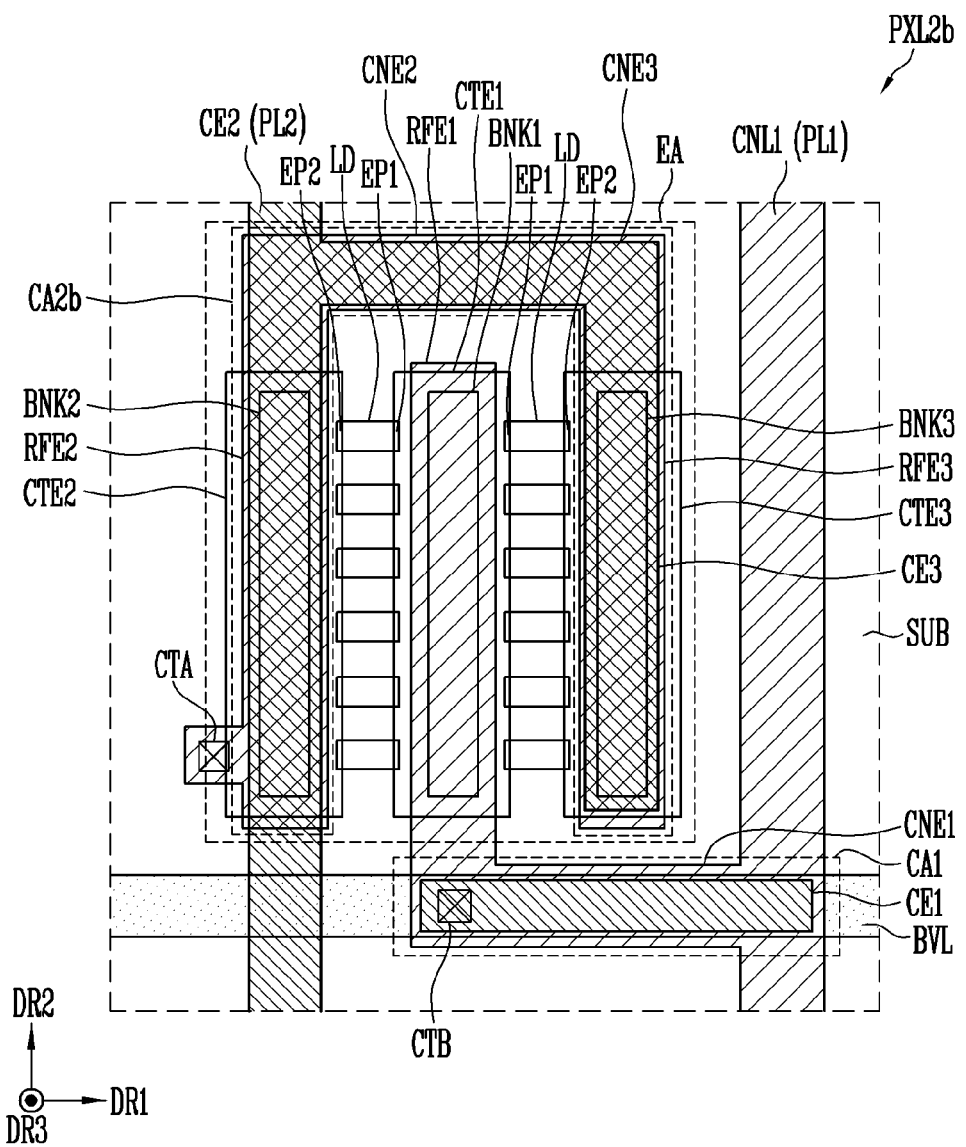
FIG. 22 illustrates a schematic top plan view of a pixel according to an embodiment.

FIG. 19 illustrates a schematic top plan view of a pixel according to an embodiment. FIG. 20 illustrates a schematic cross-sectional view taken along line B-B' of FIG. 19. FIG. 21 illustrates a schematic cross-sectional view of a pixel according to an embodiment, and illustrates a schematic cross-sectional view taken along line B-B' of FIG. 19. FIG. 22 illustrates a schematic top plan view of a pixel according to an embodiment.

An embodiment of FIG. 19 to FIG. 22 may be different from an embodiment of FIG. 5 and FIG. 6 in that a second capacitor electrode may be further formed, and other constituent elements are substantially the same or similar.

Referring to FIG. 19 to FIG. 22, a display device according to an embodiment may include a substrate SUB and a pixel PXL2 provided on the substrate SUB.

The pixel PXL2 may include a pixel circuit layer PCL disposed on the substrate SUB and a display element layer DPL disposed on the pixel circuit layer PCL.

The display element layer DPL of an embodiment may be substantially the same as or similar to the display element layer DPL described with reference to FIG. 5 and FIG. 6. All of the embodiments described in FIG. 9 to FIG. 11 may be applied to the display element layer DPL of an embodiment.

The pixel circuit layer PCL may further include a second capacitor electrode CE2 disposed to overlap the second electrode RFE2.

The second capacitor electrode CE2 may extend along the second direction DR2 in a plan view. For example, the second capacitor electrode CE2 may be substantially parallel to the first connection wire CNL1.

The second capacitor electrode CE2 may be connected to the second power line PL2, or may function as the second power line PL2. For example, the second capacitor electrode CE2 may be connected to the second driving power source (VDD in FIG. 3A) to provide the voltage of the second driving power source VDD to the transistor TR.

At least a portion of the second capacitor electrode CE2 may overlap the second electrode RFE2 disposed thereon. An area in which the second capacitor electrode CE2 and the second electrode RFE2 overlap may be a second capacitor area CA2. At least a portion of the second capacitor area CA2 may overlap the light emitting area EA in which the light emitting elements LD are disposed, but is not limited thereto.

At least one passivation layer or insulation layer may be disposed between the second capacitor electrode CE2 and the second electrode RFE2. For example, the second capacitor electrode CE2 may be formed on a same layer as the first capacitor electrode CE1, and the second passivation layer VIA2 may be disposed between the second capacitor electrode CE2 and the second electrode RFE2. For example, in the second capacitor area CA2, the second capacitor electrode CE2 and the second electrode RFE2 may form a second capacitor C2 together with the second passivation layer VIA2 interposed therebetween.

In the process of aligning the light emitting elements LD on the substrate SUB, an alternating current voltage may be supplied to the second electrode RFE2. In an embodiment, the second electrode RFE2 may not be connected or directly connected to the alternating current voltage wire, but may indirectly receive an alternating current voltage through the second capacitor electrode CE2. As described above, the second electrode RFE2 and the second capacitor electrode CE2 may form the second capacitor C2, and the second electrode RFE2 may receive an alternating current voltage supplied to the second capacitor electrode CE2 through the second capacitor C2. In this process, the second capacitor C2 may transmit only the voltage of the alternating current voltage component to the second electrode RFE2, and may not transmit the noise component (for example, direct current voltage component). Accordingly, the noise component (direct current voltage component) of the alternating current voltage supplied to the second electrode RFE2 may be removed. This will be described later in detail with reference to FIG. 23 to FIG. 27.

The disposition of the second capacitor electrode CE2 is not limited to the above description. For example, a pixel PXL2a of FIG. 21 may include a second capacitor electrode CE2a disposed between the interlayer insulation layer IL and the first passivation layer VIA1.

For example, the second capacitor electrode CE2a may be formed on a same layer as the second transistor electrode TET2. In an embodiment, the second capacitor electrode CE2a and the second transistor electrode TET2 may be integral with each other, but are not limited thereto.

In the second capacitor area CA2, the second capacitor electrode CE2a and the second electrode RFE2 may form a second capacitor C2a together with the first passivation layer VIA1 and the second passivation layer VIA2 interposed therebetween.

FIG. 22 illustrates a schematic top plan view of a pixel according to an embodiment. An embodiment of FIG. 22 may be different from the above-described embodiment in that it may further include a fifth electrode RFE3 connected to the second electrode RFE2 and a third capacitor electrode CE3 connected to the second capacitor electrode CE2. Constituent elements other than these are substantially the same or similar, so differences will be described below.

Referring to FIG. 12, FIG. 19, FIG. 20, and FIG. 22, the pixel PXL2b may include the third bank BNK3, the fifth electrode RFE3, the sixth electrode CTE3, and the third capacitor electrode CE3. The pixel PXL2b may include the second connection electrode CNE2 connecting the second electrode RFE2 and the fifth electrode RFE3, and the third connection electrode CNE3 connecting the second capacitor electrode CE2 and the third capacitor electrode CE3.

The third bank BNK3, the fifth electrode RFE3, the sixth electrode CTE3, and the second connection electrode CNE2 of the embodiment of FIG. 22 are substantially the same as the third bank BNK3, the fifth electrode RFE3, the sixth electrode CTE3, and the second connection electrode CNE2 of the embodiment of FIG. 12, so detailed descriptions thereof will be omitted.

The third capacitor electrode CE3 may be formed to overlap the third bank BNK3 and fifth electrode RFE3. For example, the third capacitor electrode CE3 may be positioned between the first electrode RFE1 and the first connection wire CNL1. The third capacitor electrode CE3 may be formed to be spaced apart from the first electrode RFE1 in the first direction DR1, and may extend along the second direction DR2.

The third capacitor electrode CE3 may be connected to the second electrode RFE2 through the third connection electrode CNE3. The second connection electrode CNE2 may extend along the first direction DR1 between the first electrode RFE1 and the fifth electrode RFE3.

The third capacitor electrode CE3 may be simultaneously formed in a same process as the second capacitor electrode CE2. The third capacitor electrode CE3 may be positioned on a same layer as the second capacitor electrode CE2.

The second capacitor electrode CE2, the third capacitor electrode CE3, and the third connection electrode CNE3 may be integral with each other, but are not limited thereto. At least one of the second capacitor electrode CE2, the third capacitor electrode CE3, and the third connection electrode CNE3 may be simultaneously formed with the first capacitor electrode CE1, but are not limited thereto. In the embodiment, the first capacitor electrode CE1, the second capacitor electrode CE2, the third capacitor electrode CE3, and the third connection electrode CNE3 may all be simultaneously formed in a same process.

The third capacitor electrode CE3 and the third connection electrode CNE3 may be disposed to overlap the fifth electrode RFE3 and the second connection electrode CNE2 positioned thereon. The second capacitor electrode CE2, the third capacitor electrode CE3, and the third connection electrode CNE3 electrically connected to each other may form one capacitor electrode, and may form the second capacitor together with the second electrode RFE2, the fifth electrode RFE3, and the second connection electrode CNE2. Accordingly, the second capacitor area CA2*b* may be an area including all of the second capacitor electrode CE2, the third capacitor electrode CE3, and the third connection electrode CNE3 in a plan view.

In the process of aligning the light emitting elements LD, the fifth electrode RFE3 may receive the same alignment voltage as the second electrode RFE2 from the third capacitor electrode CE3. Here, the alignment voltage provided to the fifth electrode RFE3 may be an alternating current voltage. The third capacitor electrode CE3 may transmit only the alternating current voltage component voltage to the fifth electrode RFE3, but may not transmit the noise component (for example, direct current voltage component). Accordingly, the noise component (direct current voltage component) of the alternating current voltage supplied to the fifth electrode RFE3 may be removed.

As described above, in case that the third capacitor electrode CE3 is further formed under or below the fifth electrode RFE3, in the process of aligning the light emitting elements LD, an alternating current voltage from which a noise is removed may be applied to the fifth electrode RFE3. Accordingly, a uniform electric field is generated between the first electrode RFE1 and the fifth electrode RFE3, so that the light emitting elements LD may be uniformly aligned, and the manufacturing efficiency of the display device may be improved.

In an embodiment, in case that other electrodes connected to the second electrode RFE2 are further formed in addition to the fifth electrode RFE3, capacitor electrodes may be formed under or below the further formed other electrodes, and an alternating current voltage from which a noise is removed may be provided to upper electrodes in case that the light emitting element is aligned.

FIG. 23 to FIG. 26 illustrate schematic top plan views for explaining a manufacturing method of a display device according to an embodiment. FIG. 27 illustrates a circuit diagram for explaining a noise removing method of voltages supplied to a display device according to an embodiment in case that a light emitting element is aligned. For example, FIG. 23 to FIG. 27 are drawings for explaining a method of aligning light emitting elements in the structure illustrated in FIG. 19 and FIG. 20.

A manufacturing method of a display device described in FIG. 23 to FIG. 27 may be different from the manufacturing method of the display device described in FIG. 13 to FIG. 18 in that a noise component may be further removed through the second capacitor electrode, and other methods are substantially the same or similar. For better understanding and ease of description, duplicate contents will be omitted.

The manufacturing method of the display device according to an embodiment will be schematically described by combining the embodiment described in FIG. 19 and FIG. 20 and FIG. 23 to FIG. 27.

Figure 23:
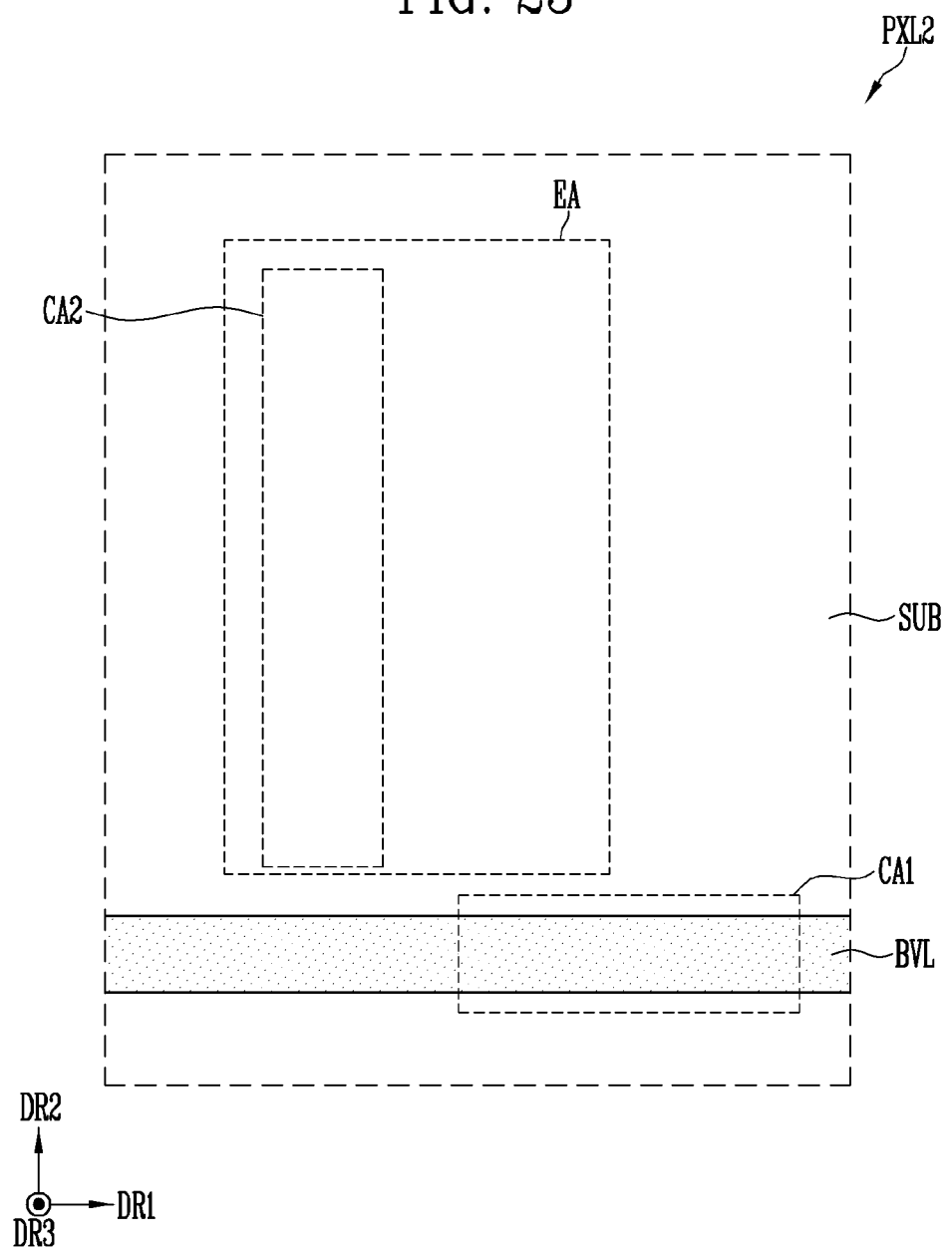
FIG. 23 to FIG. 26 illustrate schematic top plan views for explaining a manufacturing method of a display device according to an embodiment.
Figure 24:
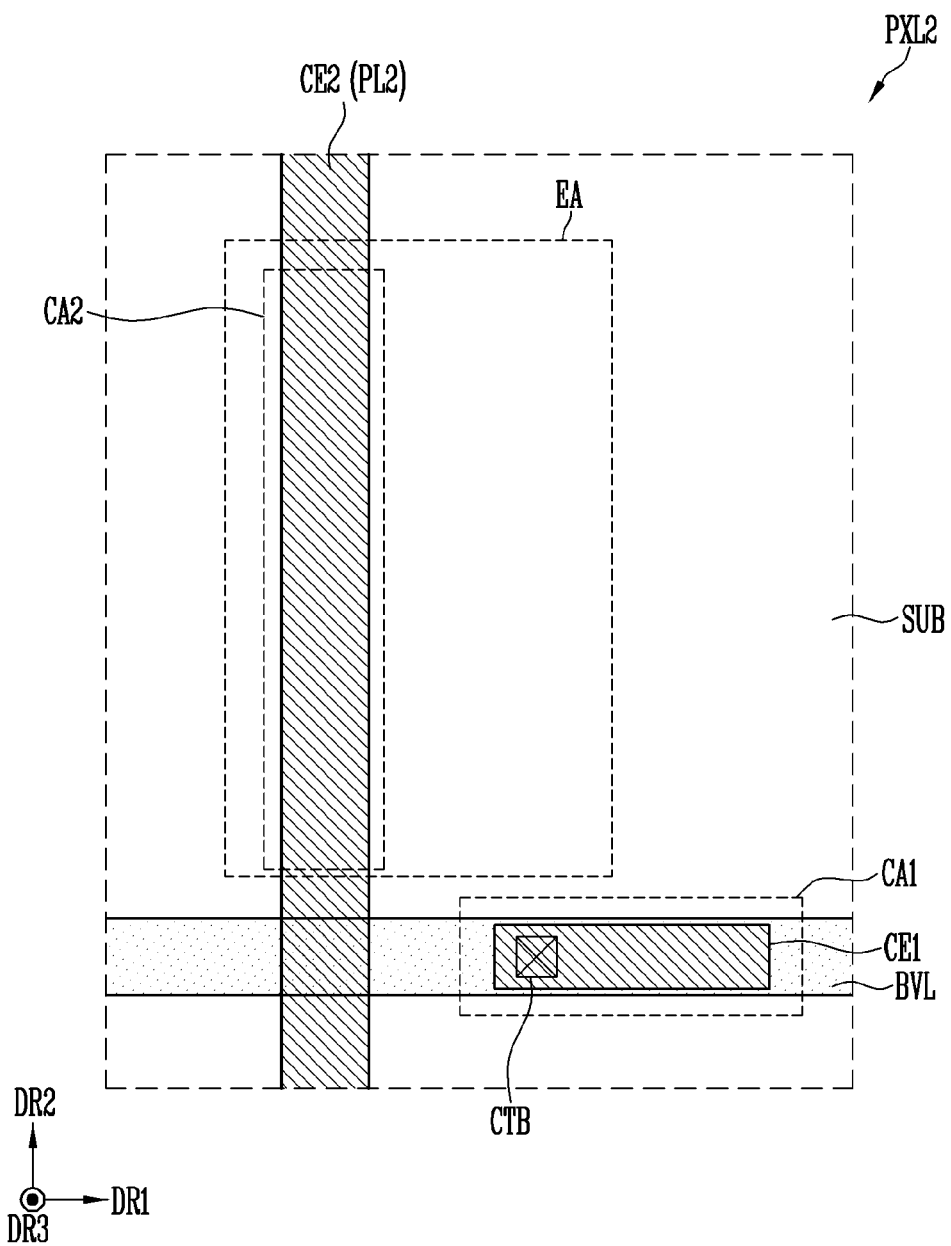

First, as shown in FIG. 23 and FIG. 24, the bypass power line BVL may be formed on the substrate SUB, and the first capacitor electrode CE1 and the second capacitor electrode CE2 may be formed on the substrate SUB on which the bypass power line BVL is formed.

The second capacitor electrode CE2 may be simultaneously formed with the first capacitor electrode CE1, but may be formed at different times. For example, the first capacitor electrode CE1 may be first formed, and the second capacitor electrode CE2 may be formed.

The second capacitor electrode CE2 may extend along the second direction DR2. At least a portion of the second capacitor electrode CE2 may overlap the light emitting area EA. At least a portion of the second capacitor electrode CE2 may overlap the bypass power line BVL, but is not limited thereto.

Figure 25:
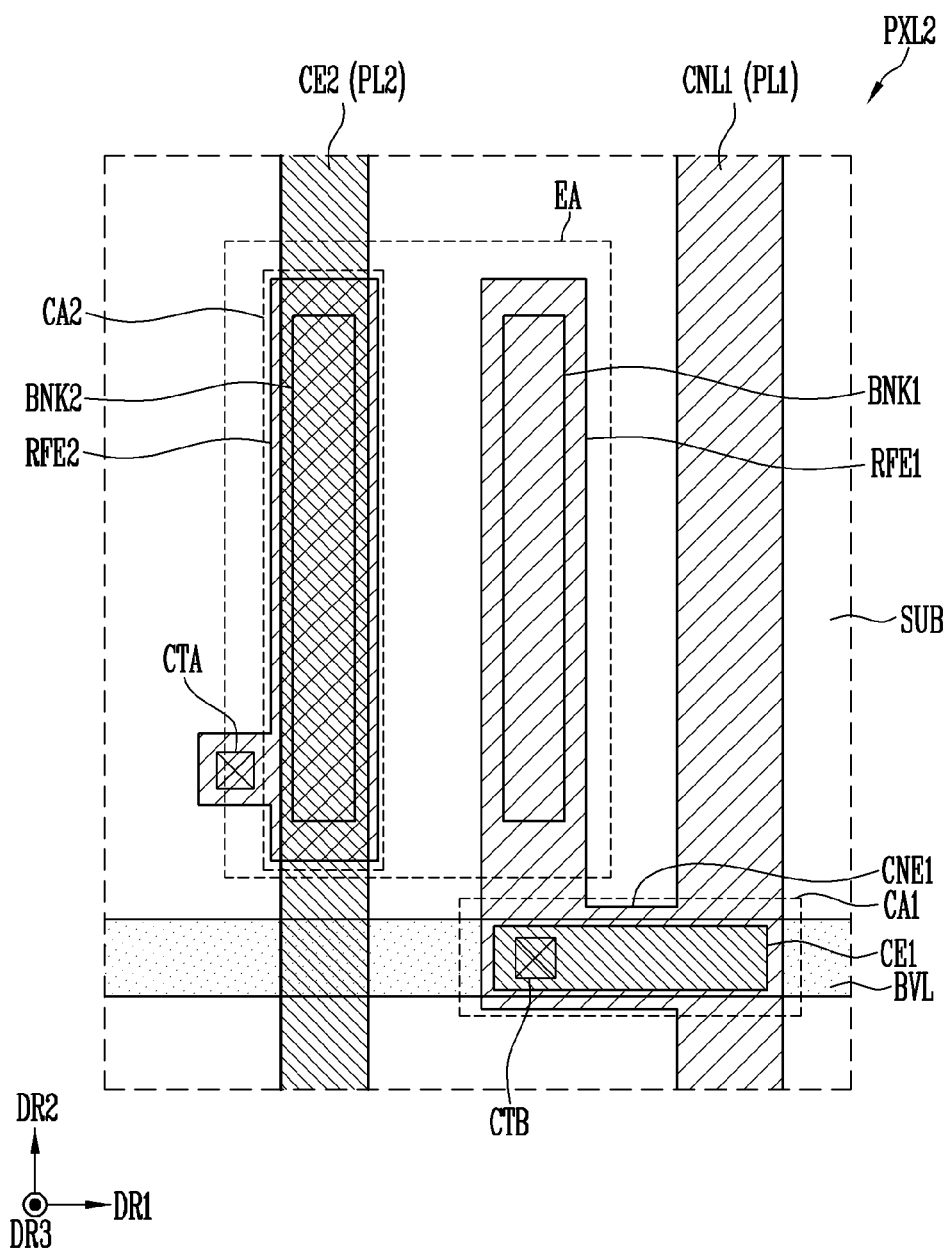

As shown in FIG. 25, the first bank BNK1 and the second bank BNK2 may be formed, and the first connection wire CNL1, the first electrode RFE1 connected to the first connection wire CNL1, and the second electrode RFE2 spaced apart from the first electrode RFE1 may be formed, on the substrate SUB on which the first capacitor electrode CE1 and the second capacitor electrode CE2 are formed.

The second electrode RFE2 may overlap the second capacitor electrode CE2. As described above, the second electrode RFE2 may extend to overlap the second capacitor electrode CE2 along the second direction DR2. The second electrode RFE2 and the second capacitor electrode CE2 may be insulated from each other by the second passivation layer VIA2 disposed therebetween, and the second electrode RFE2 and the second capacitor electrode CE2 may form the second capacitor C2 together with the second passivation layer VIA2.

Figure 26:
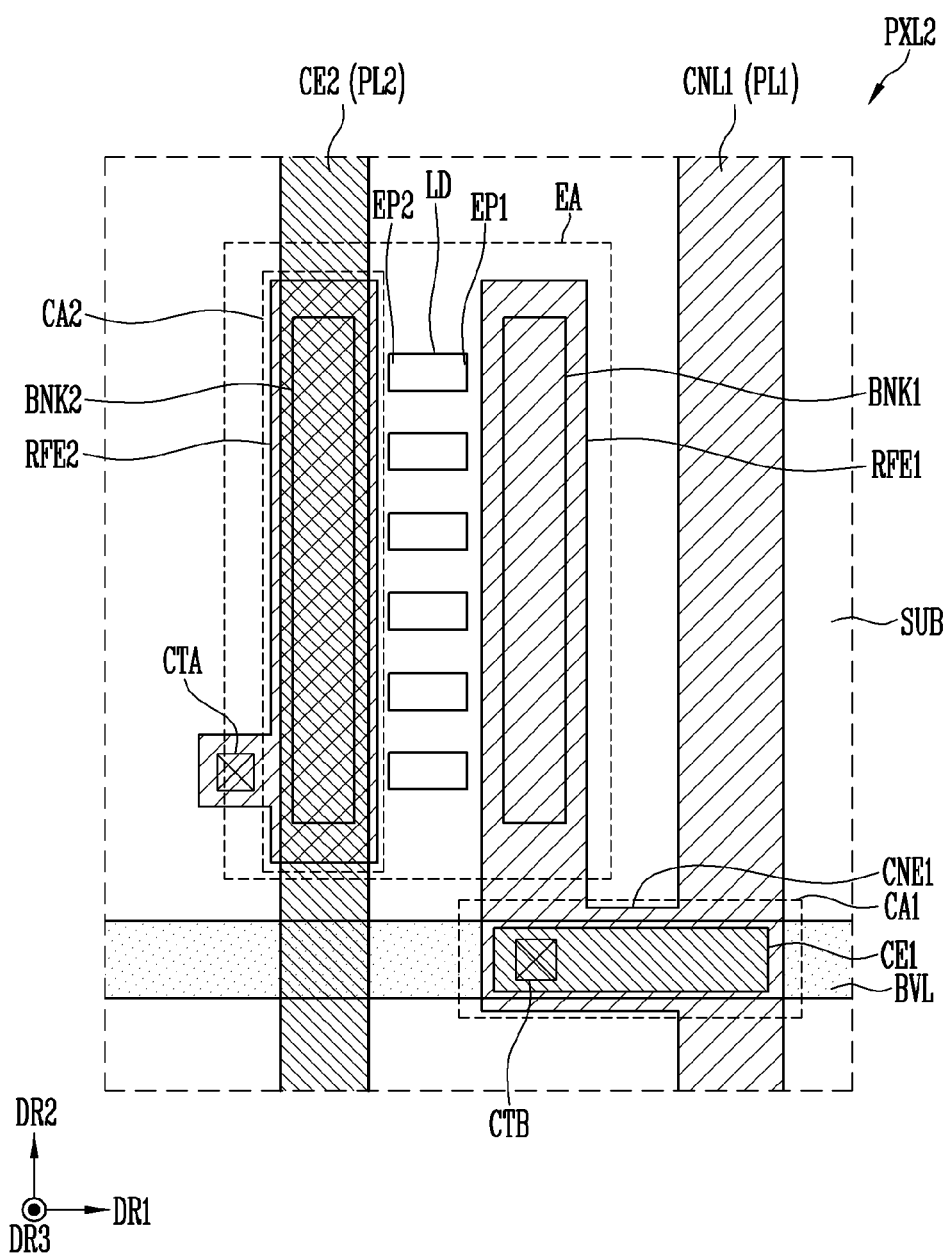
Figure 27:
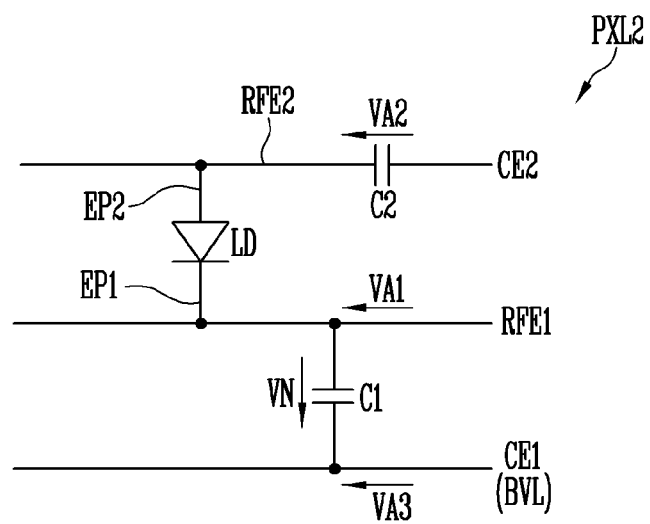
FIG. 27 illustrates a circuit diagram for explaining a noise removing method of voltages supplied to a display device according to an embodiment in case that a light emitting element is aligned.

As shown in FIG. 26 and FIG. 27, the light emitting elements LD may be aligned between the first electrode RFE1 and the second electrode RFE2.

A direct current voltage may be supplied to the first electrode RFE1, and an alternating current voltage may be supplied to the second electrode RFE2.

As described above, different alignment wires (for example, the ground voltage wires GNDL1 and GNDL2 and the alternating current voltage wires ACL1 and ACL2 of FIG. 2) may overlap each other in at least a partial area, and may be coupled to and influence each other in the overlapping areas of the ground voltage wires and the alternating current voltage wires.

For example, in the process of aligning the light emitting elements LD, the second voltage VA2, which is an alternating current voltage, may be applied to the second electrode RFE2, but due to the coupling phenomenon between the wires described above, a noise component of the direct current voltage may be included in the alternating current voltage provided to the second electrode RFE2.

The display device according to an embodiment may form the second capacitor C2 by using the second electrode RFE2 and the second capacitor electrode CE2, and may indirectly receive an alternating current voltage through the second capacitor C2.

The direct current voltage noise component voltage of the voltage provided to the second capacitor electrode CE2 is not transmitted through the second capacitor C2, so that only the alternating current voltage from which the direct current voltage noise component is removed may be transmitted to the second electrode RFE2.

The noise component (direct current voltage) of the alternating current voltage transmitted to the second electrode RFE2 is removed, so that a more uniform electric field may be formed between the first electrode RFE1 and the second electrode RFE2. Accordingly, the light emitting elements LD may be readily aligned between the first electrode RFE1 and the second electrode RFE2. For example, the alignment characteristic of the light emitting elements LD may be improved. As the light emitting elements LD are uniformly aligned in respective pixels, the display quality and manufacturing efficiency of the display device may be improved.

While embodiments are described with reference to the attached drawings, those of ordinary skill in the art to which this disclosure pertains will understand that the disclosure may be carried out in other forms without departing from the spirit and the scope of the disclosure. Therefore, it is to be understood that the above-described embodiments are for illustrative purposes only, and the scope of the disclosure is not limited thereto.

What is claimed is:

1. A display device comprising:
a conductive line disposed on a substrate;
a first capacitor electrode disposed on the conductive line and electrically connected to the conductive line;
a passivation layer disposed on the first capacitor electrode;
a first electrode disposed on the passivation layer and at least partially overlapping the first capacitor electrode in a plan view;
a second electrode spaced apart from the first electrode, the second electrode and the first electrode being disposed in a same layer as one another; and
light emitting elements disposed between the first electrode and the second electrode,
wherein the passivation layer includes an insulation material, and the first capacitor electrode and the first electrode form a first capacitor.

2. The display device of claim 1, further comprising:
a transistor disposed between the substrate and the light emitting elements and electrically connected to the light emitting elements, wherein
the transistor includes:
a semiconductor pattern disposed on the substrate;
a gate electrode disposed on the semiconductor pattern; and
a first transistor electrode and a second transistor electrode disposed on the gate electrode and electrically connected to the semiconductor pattern; and
the conductive line and the gate electrode are disposed on a same layer.

3. The display device of claim 2, wherein
the first electrode is electrically connected to a first power line, and
the first electrode receives a first driving voltage through the first power line.

4. The display device of claim 3, wherein
the first transistor electrode is electrically connected to the second electrode, and
the second transistor electrode is electrically connected to a second power line and receives a second driving voltage through the second power line, the second driving voltage being greater than the first driving voltage.

5. The display device of claim 4, wherein the first capacitor electrode and the second power line are disposed on a same layer.

6. The display device of claim 4, wherein
at least a portion of the second power line overlaps the second electrode in the plan view,
the passivation layer is disposed between the second power line and the second electrode, and
the second power line and the second electrode form a second capacitor.

7. The display device of claim 3, wherein the first capacitor electrode and the first transistor electrode are disposed on a same layer.

8. The display device of claim 3, wherein
the conductive line extends in a first direction in the plan view, and
the first power line extends in a second direction intersecting the first direction in the plan view.

9. The display device of claim 8, further comprising:
a first connection electrode electrically connecting the first electrode to the first power line and extending in the first direction,
wherein the first electrode extends in the second direction,
at least a portion of the first connection electrode overlaps the first capacitor electrode in the plan view, and
the first electrode, the first connection electrode, and the first power line are integral with each other.

10. The display device of claim 8, further comprising:
a third electrode, the third electrode and the second electrode being disposed on a same layer, wherein
the first electrode is disposed between the second electrode and the third electrode in the plan view, and
the light emitting elements are disposed between the first electrode and the third electrode.

11. The display device of claim 10, further comprising:
a second connection electrode electrically connecting the second electrode to the third electrode and extending in the first direction,
wherein the second electrode, the third electrode, and the second connection electrode are integral with each other.

12. The display device of claim 1, further comprising:
a third electrode electrically contacting the first electrode and a first end portion of the light emitting elements; and
a fourth electrode electrically contacting the second electrode and a second end portion of the light emitting elements.

13. The display device of claim 12, further comprising:
an insulation layer disposed on the first electrode and the second electrode,
wherein the insulation layer includes:
a first opening exposing at least a portion of the first electrode; and a second opening exposing at least a portion of the second electrode, the third electrode electrically contacts the first electrode through the first opening of the insulation layer, and the fourth electrode electrically contacts the second electrode through the second opening of the insulation layer.

14. The display device of claim 13, further comprising:
a fixing layer disposed on the insulation layer and the light emitting elements,
wherein the fixing layer contacts at least a portion of an outer circumferential surface of each of the light emitting elements, and exposes the first end portion and the second end portion of each of the light emitting elements.

15. The display device of claim 1, further comprising:
a first bank disposed between the first electrode and the passivation layer and overlapping the first electrode in the plan view; and
a second bank disposed between the second electrode and the passivation layer and overlapping the second electrode in the plan view.

16. A display device comprising:
a conductive line disposed on a substrate;
a first capacitor electrode disposed on the conductive line and electrically connected to the conductive line;
a second capacitor electrode disposed on the conductive line and spaced apart from the first capacitor electrode;
a passivation layer disposed on the first capacitor electrode and the second capacitor electrode;
a first electrode disposed on the passivation layer and at least partially overlapping the first capacitor electrode in a plan view;
a second electrode spaced apart from the first electrode and at least partially overlapping the second capacitor electrode in the plan view, the second electrode and the first electrode being disposed on a same layer; and
light emitting elements disposed between the first electrode and the second electrode.

17. The display device of claim 16, wherein
the passivation layer includes an insulation material,
the first capacitor electrode and the first electrode form a first capacitor, and
the second capacitor electrode and the second electrode form a second capacitor.

18. The display device of claim 17, wherein the first capacitor electrode and the second capacitor electrode are disposed on a same layer.

19. The display device of claim 16, further comprising:
a transistor disposed between the substrate and the light emitting elements and electrically connected to the light emitting elements, wherein
the transistor includes:
a semiconductor pattern disposed on the substrate;
a gate electrode disposed on the semiconductor pattern; and
a first transistor electrode and a second transistor electrode disposed on the gate electrode and electrically connected to the semiconductor pattern,
the first transistor electrode is electrically connected to the second electrode,
the second transistor electrode is electrically connected to the second capacitor electrode, and
the conductive line and the gate electrode are disposed on a same layer.

20. The display device of claim 16, wherein
the conductive line extends in a first direction in the plan view, and
the second capacitor electrode extends in a second direction intersecting the first direction in the plan view.

21. The display device of claim 20, further comprising:
a third electrode, the third electrode and the second electrode being disposed on a same layer; and
a second connection electrode electrically connecting the second electrode to the third electrode and extending in the first direction, wherein
the first electrode is disposed between the second electrode and the third electrode in the plan view, and
the light emitting elements are disposed between the first electrode and the third electrode.

22. The display device of claim 21, further comprising:
a third capacitor electrode, the third capacitor electrode and the second capacitor electrode being disposed on a same layer; and
a third connection electrode electrically connecting the second capacitor electrode to the third capacitor electrode and extending in the first direction, wherein
at least a portion of the third capacitor electrode overlaps the third electrode in the plan view,
at least a portion of the third connection electrode overlaps the second connection electrode in the plan view, and
the first capacitor electrode, the second capacitor electrode, the third capacitor electrode, and the third connection electrode are disposed on a same layer.

* * * * *